(12) United States Patent
Muroyama et al.

(10) Patent No.: US 8,336,399 B2
(45) Date of Patent: Dec. 25, 2012

(54) SENSOR SYSTEM

(75) Inventors: Masanori Muroyama, Sendai (JP);
Masayoshi Esashi, Sendai (JP); Shuji Tanaka, Sendai (JP); Sakae Matsuzaki, Sendai (JP); Mitsutoshi Makihata, Sendai (JP); Yutaka Nonomura, Nagoya (JP); Motohiro Fujiyoshi, Seto (JP); Takahiro Nakayama, Nagoya (JP); Ui Yamaguchi, Toyota (JP); Hitoshi Yamada, Aichi-gun (JP)

(73) Assignees: Tohoku University, Sendai-shi (JP); Kabushiki Kaisha Toyota Chuo Kenkyusho, Aichi-gun (JP); Toyota Jidosha Kabushiki Kaisha, Toyota-shi (JP)

( * ) Notice: Subject to any disclaimer, the term of this patent is extended or adjusted under 35 U.S.C. 154(b) by 91 days.

(21) Appl. No.: 12/903,673

(22) Filed: Oct. 13, 2010

(65) Prior Publication Data

US 2011/0083517 A1 Apr. 14, 2011

(30) Foreign Application Priority Data

Oct. 14, 2009 (JP) ................................. 2009-236913

(51) Int. Cl.
*G01D 7/00* (2006.01)
(52) U.S. Cl. .................................................. 73/862.046
(58) Field of Classification Search .............. 73/862.046
See application file for complete search history.

(56) References Cited

U.S. PATENT DOCUMENTS

| | | | | |
|---|---|---|---|---|
| 4,928,513 A | * | 5/1990 | Sugihara et al. | 73/25.03 |
| 5,493,220 A | * | 2/1996 | Oliver et al. | 324/209 |
| 5,713,122 A | * | 2/1998 | Aboaf et al. | 29/603.08 |
| 6,155,120 A | * | 12/2000 | Taylor | 73/862.046 |
| 7,882,750 B2 | * | 2/2011 | Davis et al. | 73/861.18 |

FOREIGN PATENT DOCUMENTS

| | | |
|---|---|---|
| JP | 62-123326 A | 6/1987 |
| JP | 04-057695 A | 2/1992 |
| JP | 05-081977 A | 4/1993 |
| JP | 2002-116101 A | 4/2002 |
| JP | 2004-085304 A | 3/2004 |
| JP | 2004-358634 A | 12/2004 |
| JP | 2005-003649 A | 1/2005 |
| JP | 2006-064408 A | 3/2006 |
| JP | 2006-205345 A | 8/2006 |
| JP | 2007-010383 A | 1/2007 |
| JP | 2007-196372 A | 8/2007 |
| JP | 2006-208248 A | 8/2008 |
| JP | 2008-281403 A | 11/2008 |

OTHER PUBLICATIONS

Office Action issued in JP 2009-236913 on Sep. 13, 2011 and partial English translation thereof.

* cited by examiner

*Primary Examiner* — Lisa Caputo
*Assistant Examiner* — Octavia Davis-Hollington
(74) *Attorney, Agent, or Firm* — Kenyon & Kenyon LLP

(57) ABSTRACT

A sensor system includes a first sensing device that includes a sensor, and first and second surrounding portions that surround the sensor at least partially, a second sensing device that comprises a sensor, and first and second surrounding portions that surround the sensor at least partially, wherein at least one of a combination of shapes of the first and second surrounding portions of the respective first and second sensing devices and a combination of physical properties of the first and second surrounding portions of the respective first and second sensing devices is configured such that a detection characteristic of the first sensing device is different from a detection characteristic of the second sensing device.

22 Claims, 38 Drawing Sheets

SENSOR SYSTEM

INCORPORATION BY REFERENCE

This application is based upon and claims the benefit of priority from Japanese patent application No. 2009-236913, filed on Oct. 14, 2009, the disclosure of which is incorporated herein in its entirety by reference.

BACKGROUND OF THE INVENTION

1. Field of the Invention

The present invention relates to a sensor system which is suitable for detecting a contact with an object. The sensor system may be a tactile sensor system provided on a surface (e.g., a hand or an entire body surface) of a robot, for example.

2. Description of Related Art

The development of humanoid robots has been in progress. Such humanoid robots are expected to perform sophisticated actions such as touching with a human, autonomously avoiding an obstacle, and grasping and transporting an object. Since sensing of touch is necessary for such actions, a technique for providing a tactile sensor(s) on a hand portion of a robot or the entire body surface of a robot has been studied in recent years (e.g., Japanese Unexamined Patent Application Publication Nos. 2008-281403 and 2006-208248).

A human can distinguish between two different objects by their textures even when they are similar in size and weight, such as between an apple and a pear. Such a high-level sensing function would be more preferable in humanoid robots in the future, and therefore various types of tactile sensors would be in need. For example, it is preferable to simultaneously detect various types of factors such as a vertical stress, a shearing force, slide, a chatter vibration, and a friction.

The high-level sensing for detecting small differences may be achieved by providing various types of sensors. However, a lot of various types of sensors may be required. Therefore, it poses a problem that the manufacturing costs increase enormously. Further, there is another problem that managing various types of small sensors is very troublesome.

SUMMARY OF THE INVENTION

A sensor system in accordance with the present invention is a sensor system including: a first sensing device that comprises a sensor, and first and second surrounding portions that surround the sensor at least partially; a second sensing device that comprises a sensor, and first and second surrounding portions that surround the sensor at least partially, wherein at least one of a combination of shapes of the first and second surrounding portions of the respective first and second sensing devices and a combination of physical properties of the first and second surrounding portions of the respective first and second sensing devices is configured such that a detection characteristic of the first sensing device is different from a detection characteristic of the second sensing device.

It is preferable that a combination of hardness of the first and second surrounding portions of the respective first and second sensing devices is configured such that at least one of a response speed and a sensitivity characteristic for an externally-applied force is different between the first and second sensing devices.

It is preferable that a combination of thicknesses of the first and second surrounding portions of the respective first and second sensing devices is configured such that at least one of a response speed and a sensitivity characteristic for an externally-applied force is different between the first and second sensing devices.

It is preferable that at least one of a combination of thermal conductivities and heat capacities of the first and second surrounding portions of the respective first and second sensing devices is configured such that at least one of a response speed and a sensitivity characteristic for externally-applied heat is different between the first and second sensing devices.

It is preferable that a plurality of sensing devices including the first and second sensing devices are arranged in one-dimensional manner or two-dimensional manner, and number of sensing devices having faster response speed for an externally-applied force or heat is greater than number of sensing devices having a slower response speed.

It is preferable that at least one of the first and second surrounding portions of the first sensing device is separated from at least one of the corresponding first and second surrounding portions of the second sensing device.

It is preferable that the second surrounding portion of the first sensing device is common with the second surrounding portion of the second sensing device, and the second surrounding portion forms an external surface of the first and second sensing devices.

It is preferable that the first surrounding portion of the first sensing device is common with the first surrounding portion of the second sensing device.

It is preferable that the first and second surrounding portions of the respective first and second sensing devices comprise a semicylindrical shape, and a plurality of sensing devices including the first and second sensing devices are arranged in a row.

It is preferable that a protrusion is provided on an external surface of the first or second sensing device.

It is preferable that a plurality of protrusions are provided on an external surface of the first or second sensing device.

It is preferable that a concentric or spiral streak-like protrusion is provided on an external surface of the first or second sensing device.

It is preferable that an external surface of the first or second sensing device is covered with spherical or frustum protrusions.

It is preferable that at least one of the first and second sensing devices comprises an externally-protruding needle-like member, and the needle-like member comprises a root portion buried in at least one of the first and second surrounding portions, and a tip portion protruding externally from the first and second surrounding portions.

It is preferable that the root portion of the needle-like member has a larger width than the tip portion of the needle-like member.

It is preferable that the needle-like member is disposed so as to be inclined with respect to a ground-contact surface on which at least one of the first and second sensing devices is disposed.

It is preferable that the needle-like member is disposed perpendicularly to a ground-contact surface on which at least one of the first and second sensing devices is provided.

It is preferable that a plurality of needle-like members are provided in at least one of the first and second sensing devices.

It is preferable that the needle-like members are disposed in different directions from each other.

It is preferable that at least one of the first and second sensing devices comprises a plurality of the sensors, and a difference between detection results of the respective sensors is utilized.

It is preferable that the second surrounding portion of at least one of the first and second sensing devices is formed to comprise a tongue-shaped portion, and a plurality of sensors are disposed so as to sandwich the tongue-shaped portion.

It is preferable that wherein a sensor has unevenness on its surface.

It is preferable that the sensor system further includes a bus on which a plurality of sensing devices including the first and second sensing devices are mounted, wherein output signals from the first and second sensing devices flow through the bus.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Exemplary embodiments in accordance with the present invention are illustrated in figures and explained with reference to signs assigned to respective elements in the figures.

[First Exemplary Embodiment]

Figure 1:
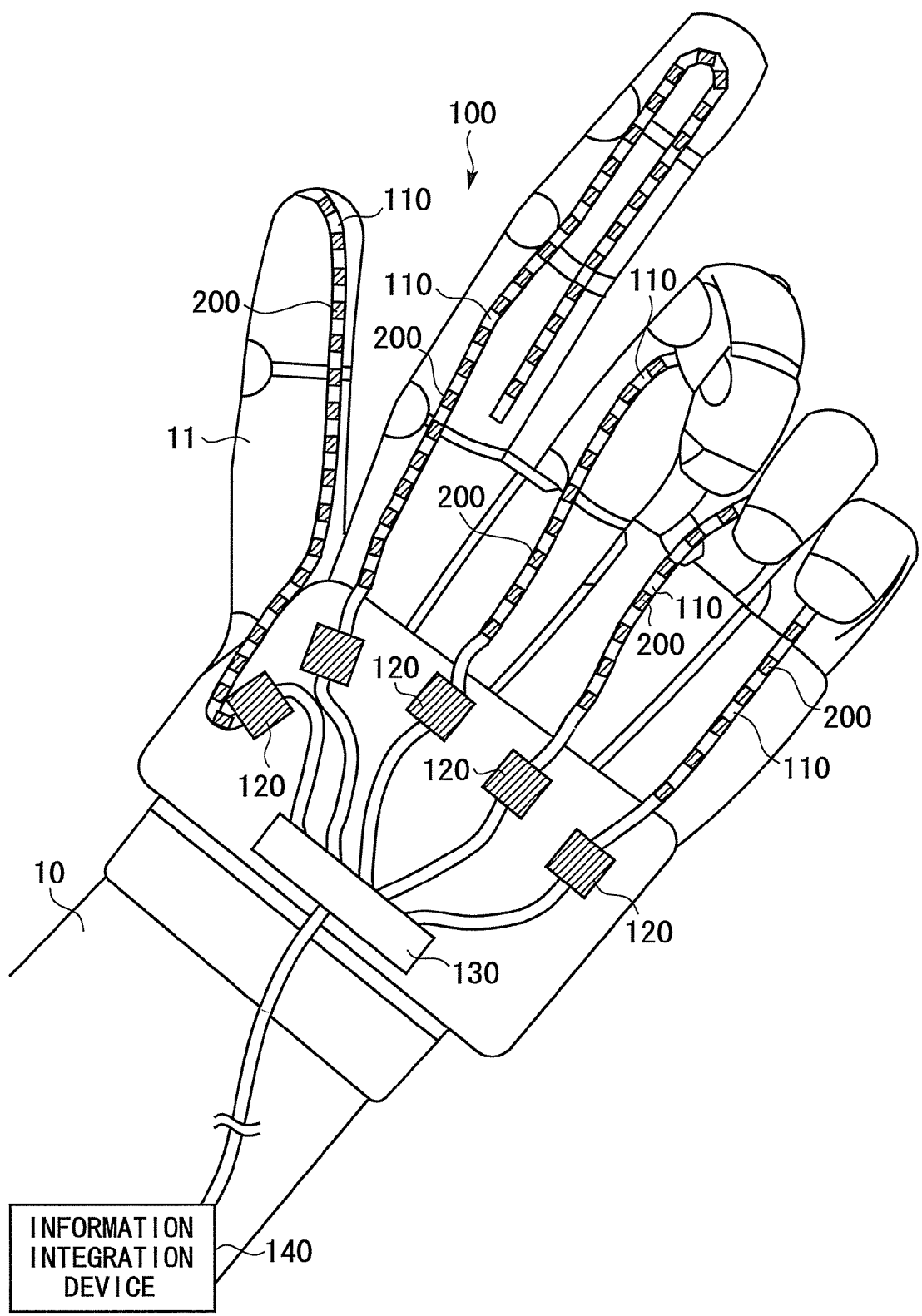
FIG. 1 is a schematic figure showing an aspect where a tactile sensor system in which a number of sensing devices are disposed is being applied to a hand of a robot.

FIG. 1 shows an aspect where a tactile sensor system having a number of sensing devices therein is being applied to a hand of a robot.

As shown in FIG. 1, the sensing devices 200 of this exemplary embodiment are arranged on a hand 11 of a robot 10 or the entire body surface of a robot, and a tactile sensor system 100 as a whole is being configured by the sensing devices 200. A plurality of sensing devices 200 are provided in each of buses 110. Further, all the buses 110 are connected to an information integration device 140 through an information relay device 120 and a line concentrator 130.

For example, when the hand 11 of the robot 10 grasps an object (not shown) and the surface of the robot 10 thereby comes into contact with the object, each of the sensing devices 200 detects the contact. Further, each of the sensing devices 200 performs digital signal processing of a sensor signal. Then, the sensor signal on which the digital signal processing was performed is transmitted from each of the sensing devices 200 to the information integration device 140. The information integration device 140 integrates information from the sensing devices 200 and thereby detects how much force is exerted at what position.

Figure 2:
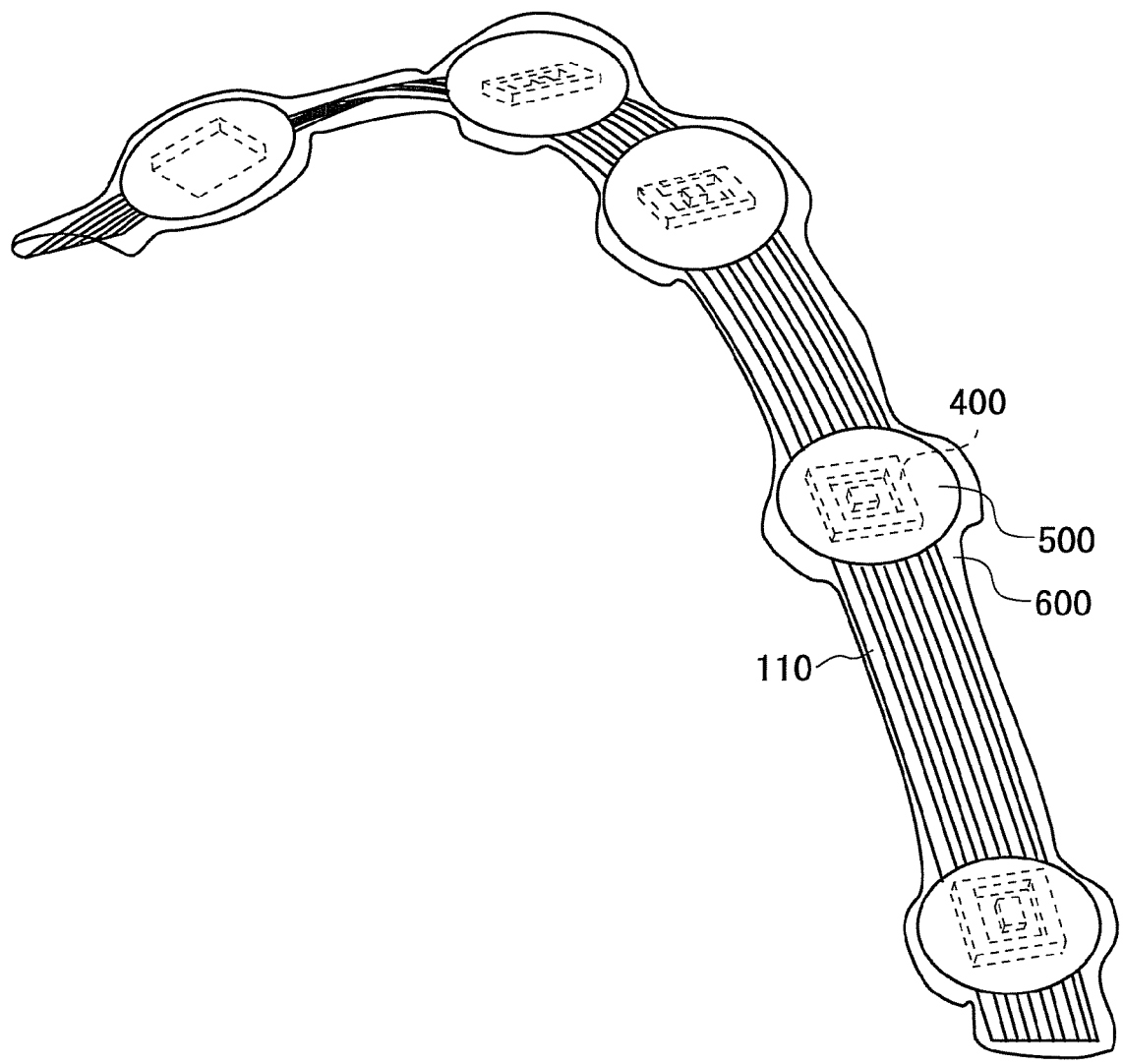
FIG. 2 is a schematic figure showing an aspect where sensing devices are disposed in a bus.

FIG. 2 shows an aspect where a plurality of sensing devices 200 are disposed in a bus 110. As shown in FIG. 2, each of the sensing devices 200 includes a sensor 400, an inner layer portion (first surrounding portion) 500 wrapping the sensor 400, and an outer layer portion 600 (second surrounding portion) forming the outer surface of the sensing device 200. Note that the inner layer portion surrounds the sensor 400, and the outer layer portion 600 surrounds the inner layer portion 500. The outer layer portion 600 surrounds the sensor 400 via the inner layer portion 500.

Figure 3:
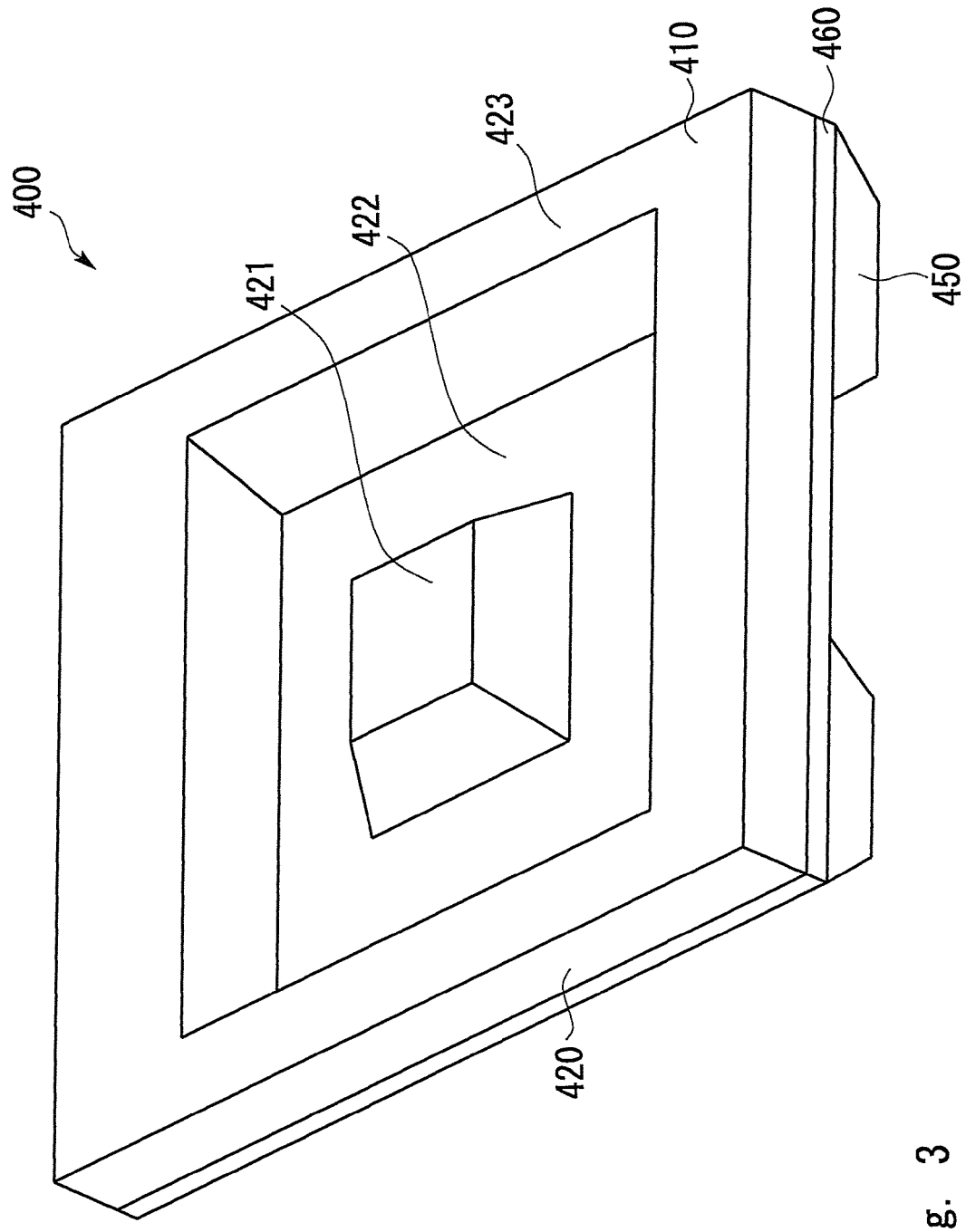
FIG. 3 is a perspective view of a sensor as views from the front.
Figure 4:
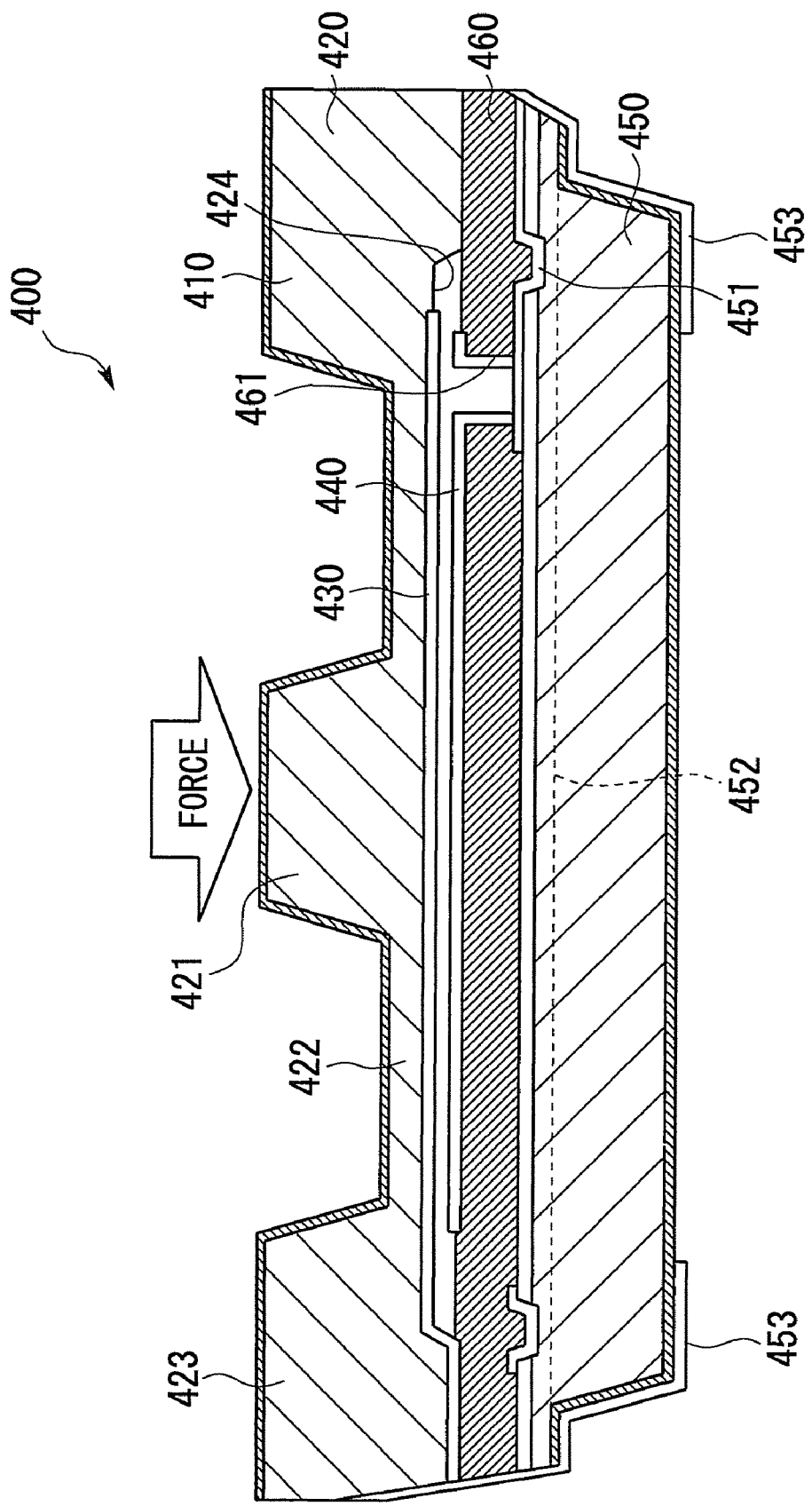
FIG. 4 is a schematic cross sectional view of a sensor.

Firstly, the sensor 400 is explained hereinafter. FIG. 3 is a schematic perspective view of a sensor 400 as viewed from the front. FIG. 4 is a schematic cross sectional view of the sensor 400.

As shown in FIG. 4, the sensor 400 has such a configuration that a sensor structure portion 410 and a semiconductor substrate 450 are bonded together with an adhesive layer 460. The sensor structure portion 410 includes a main structure body 420, an upper sensor electrode (first sensor electrode) 430, and a lower sensor electrode (second sensor electrode) 440. The main structure body 420 is formed of Si.

As shown in FIG. 4, a projecting force transfer portion 421 is provided at the center of the main structure body 420, and a recessed thinner portion 422 is formed around the force transfer portion 421. The thinner portion 422 has elasticity, so that the main structure body 420 functions as an operative film. That is, when a force is applied on the force transfer portion 421, the main structure body 420 is bent. In this area, a tactile sensing surface is formed by the force transfer portion 421. The peripheral portion surrounding the thinner portion 422 serves as a support frame portion 423 that supports the operative film. Further, a recessed portion 424 is formed on the rear surface of the main structure body 420.

The upper sensor electrode 430 is provided in the recessed portion 424 formed on the rear surface of the main structure body 420. The upper sensor electrode 430 serves as a movable electrode that moves together with the operative film in accordance with the external pressure applied thereto as schematically shown in FIG. 4.

The lower sensor electrode 440 is disposed directly above the adhesive layer 460. The distance between the upper sensor electrode 430 and the lower sensor electrode 440 is defined by the depth of the recessed portion 424. The lower sensor electrode 440 serves as a fixed electrode, and the upper sensor electrode 430 and lower sensor electrode 440, which are disposed opposite to each other, form a capacitive element. The lower sensor electrode 440 is connected to a rewiring layer 451 of the semiconductor substrate 450 through a via 461. The first and second sensor electrodes 430 and 440 are hermetically contained inside the sensor 400.

An integrated circuit 452 for signal processing is embedded in the semiconductor substrate 450. The integrated circuit 452 processes a sensor signal supplied from the sensor structure portion 410, and outputs a data signal from an external terminal(s) 453 wired out to the rear surface of the semiconductor substrate 450.

Note that although the force detection sensor is shown as an example of the sensor 400 in the above explanation, the type of the sensor 400 is arbitrary and it may be replaced by a pressure detection sensor, an acceleration detection sensor, a displacement detection sensor, a vibration detection sensor, or a temperature detection sensor.

Here, the displacement detection sensor may be an extension sensitive type sensor that detects such a state that the external force is small but the displacement is large. Further, the vibration detection sensor may be a sensor that detects the vibration factor of a force and/or displacement in a characteristic fashion, and the vibration detection sensor detects, for example, a chatter vibration that occurs when an object is rubbed against and/or slides on the outer surface.

Although objects detected by the sensor 400 may be widely varied as described above, it is preferable to form unevenness on the surface of the sensor 400. By providing the unevenness on the surface of the sensor 400 as described above, the bonding between the sensor 400 and the inner layer portion 500 becomes stronger. As a result, a force applied on the surface of the outer layer portion 600 can be more easily transferred to the sensor 400. Further, by providing the unevenness on the surface of the sensor 400, heat can be more easily transferred from the inner layer portion 500 to the sensor 400.

Further, as described above, the sensor electrodes 430 and 440 and the integrated circuit 452 are preferably hermetically contained inside the sensor 400. When the inner layer portion 500 and the outer layer portion 600 are formed of a pliable resin, there is a possibility that moisture, an organic solvent, and the like could infiltrate into the outer layer portion 600 and the inner layer portion 500. Even in the case like this, the sensor 400 has sufficient durability because the the sensor electrodes 430 and 440 and the integrated circuit 452 are hermetically contained. As shown in FIG. 4, the sensor electrodes 430 and 440 are placed between the main structure body 420 and the semiconductor substrate 450, the integrated circuit 452 is formed on the upper main surface of the semiconductor substrate 450, thereby the sensor electrodes 430 and 440 and the integrated circuit 452 are being secured preferably.

Figure 5:
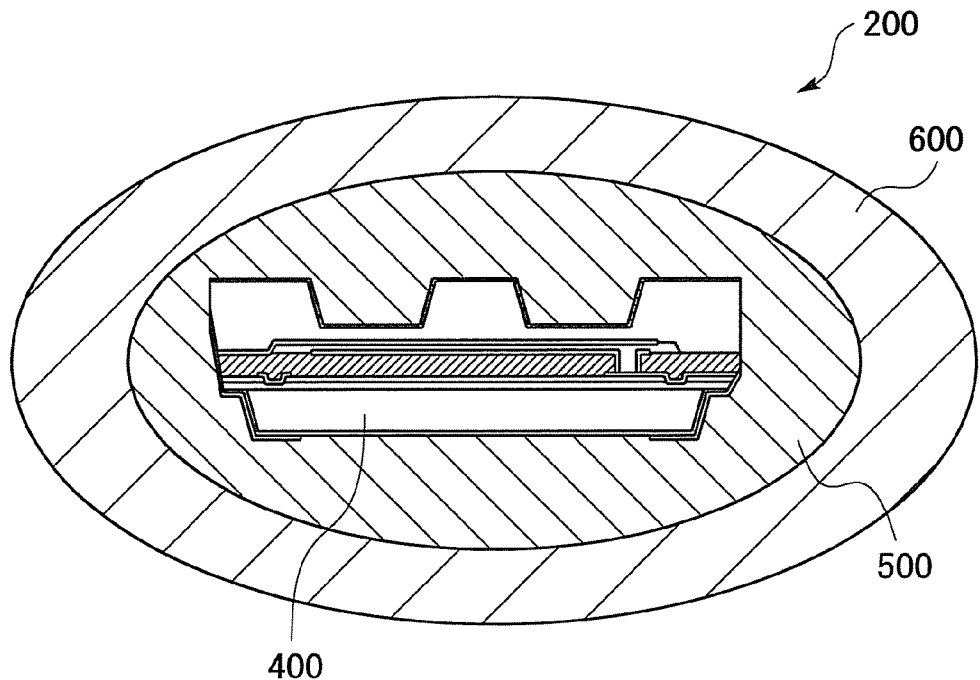
FIG. 5 is a schematic cross sectional view of a sensing device.

FIG. 5 is a cross sectional view of one sensing device 200. A sensor 400 is wrapped by an inner layer portion 500. Further, the outside of the inner layer portion 500 is covered by an outer layer portion 600. Both the inner layer portion 500 and the outer layer portion 600 are formed of a pliable resin. Note that the outer layer portion 600 may completely wrap the inner layer portion 500 therein as shown in FIG. 5, but the wrapping manner should not be limited as such.

Figure 6:
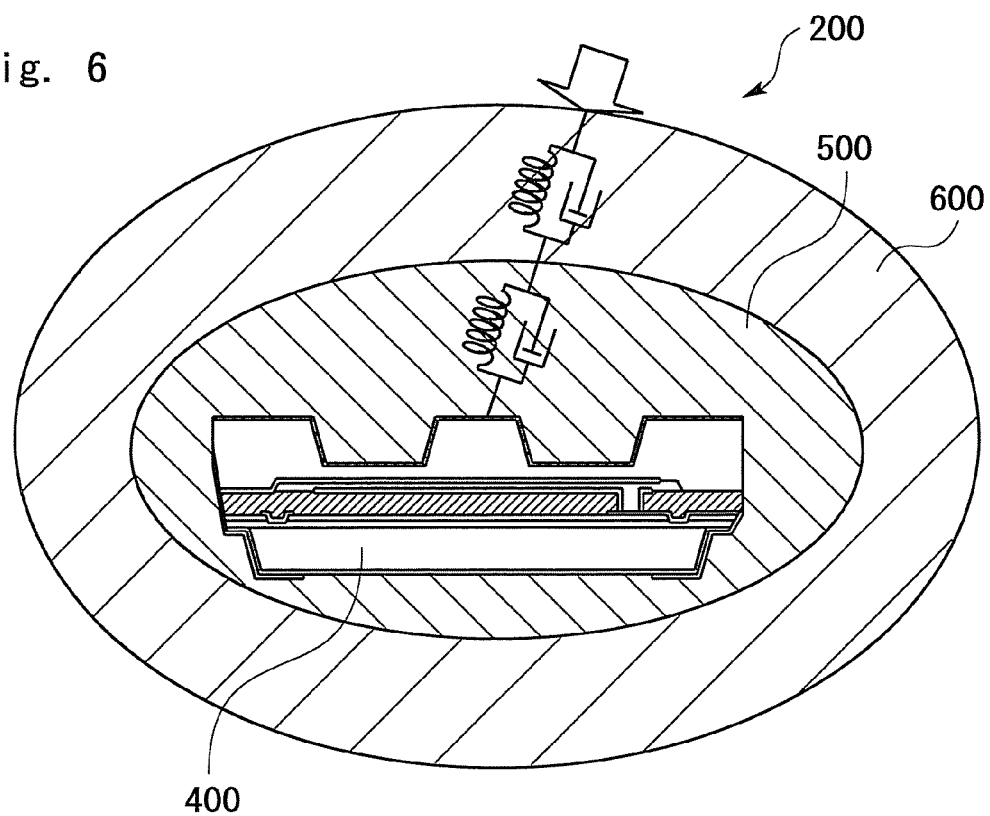
FIG. 6 is a schematic figure expressing the elastic constant and dumping factor of an inner layer portion and an outer layer portion.

A number of sensing devices 200 are provided in the tactile sensor system 100. Further, the shapes and/or characteristics of the inner layer portions 500 and the outer layer portions 600 of the sensing devices 200 are changed from one sensing device to another according to their uses so that each of the sensing devices 200 has a different sensor characteristic (sensitivity characteristic). That is, the combination of properties, such as thicknesses (shapes), elastic constants, dumping factors, thermal conductivities, and heat capacities (physical properties), of the inner layer portion 500 and the outer layer portion 600 is changed. In this way, it becomes possible to change the transfer distribution of a force and/or heat transferred from the surface of the outer layer portion 600 to the sensor 400 among the sensing devices 200, and thereby the response property of the sensing devices 200 is being controlled to have a variety. FIG. 6 is a schematic figure showing the elastic constant and the dumping factor of the inner layer portion 500 and the outer layer portion 600.

Examples of the material used to form the inner layer portion 500 and the outer layer portion 600 may include silicone, rubber, polyethylene (PE), polypropylene (PP), polyvinyl chloride (PVC), polyvinylidene chloride, polystyrene (PS), and polyvinyl acetate, but it should not be limited as such.

Figure 7:
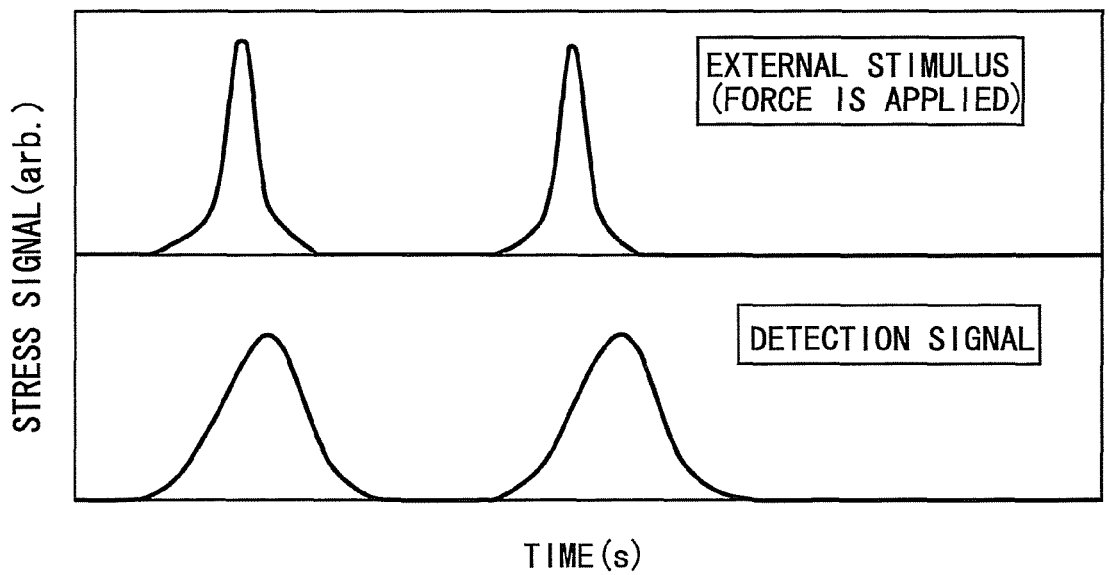
FIG. 7 is a schematic figure showing an example of detection signals when the combination of the hardness of an inner layer portion and the hardness of an outer layer portion is changed.

FIGS. 7, 8, 9 and 10 show examples of detection signals obtained when combination of the hardness of the inner layer portion 500 and that of the outer layer portion 600 is changed. FIG. 7 is an example where both the inner layer portion 500 and the outer layer portion 600 are formed of a hard resin. Here, the term "hard" means that the elastic constant is higher and the dumping factor is smaller. When both the inner layer portion 500 and the outer layer portion 600 are formed of a hard resin, an external stimulus is swiftly transferred to the sensor 400. That is, the detection speed becomes higher, and the response to an external stimulus thereby becomes faster.

Figure 8:
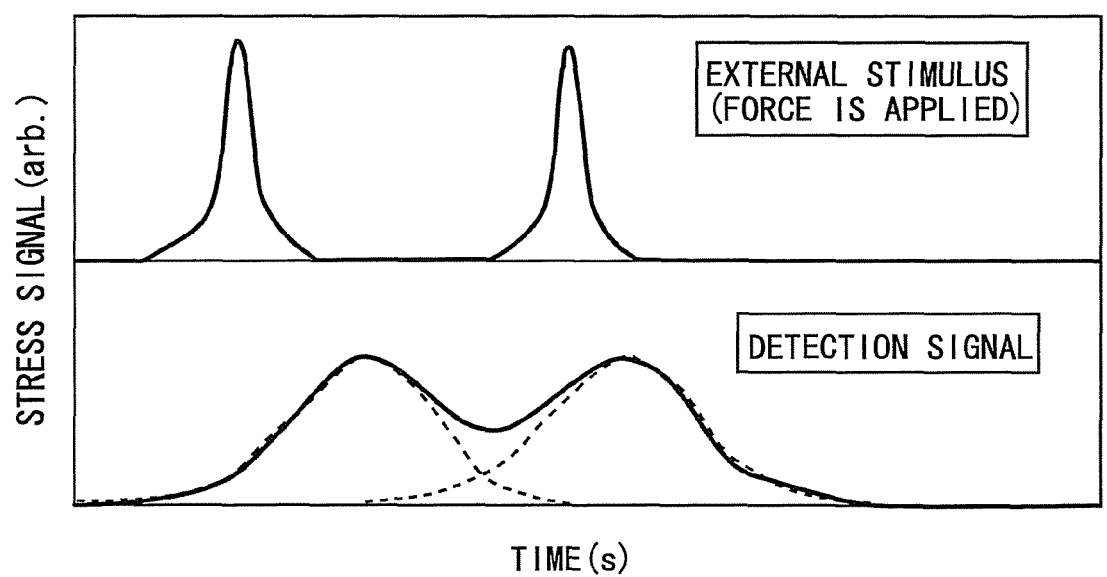
FIG. 8 is a schematic figure showing an example of detection signals when the combination of the hardness of an inner layer portion and the hardness of an outer layer portion is changed.

FIG. 8 is an example where both the inner layer portion 500 and the outer layer portion 600 are formed of a soft resin. Here, the term "soft" means that the elastic constant is lower and the dumping factor is larger. When both the inner layer portion and the outer layer portion are formed of a soft resin, an external stimulus is slowly transferred to the sensor 400. That is, the response speed becomes lower, and detection in a time-integration fashion thereby becomes possible.

Figure 9:
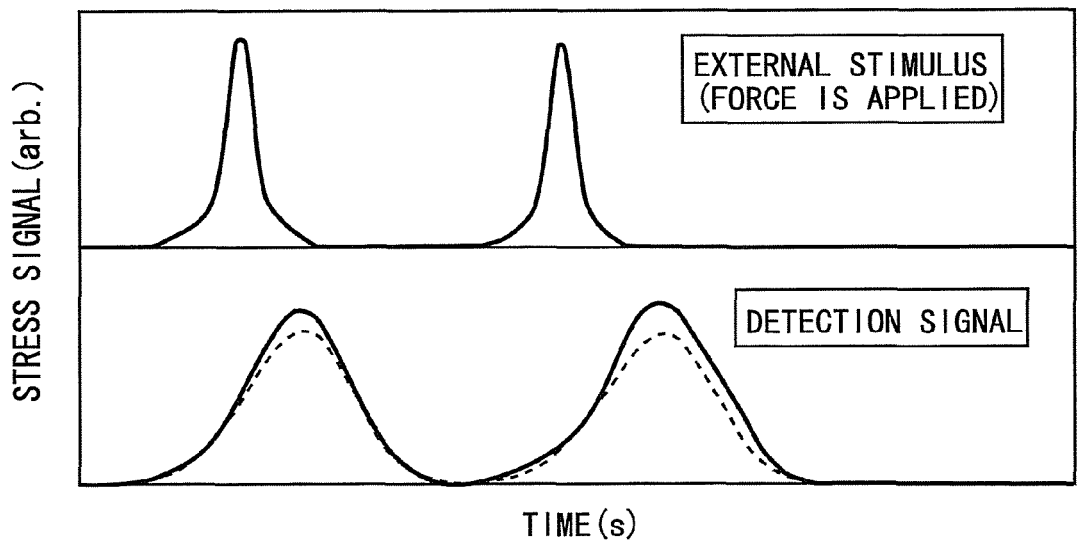
FIG. 9 is a schematic figure showing an example of detection signals when the combination of the hardness of an inner layer portion and the hardness of an outer layer portion is changed.

FIG. 9 is an example where one of the inner layer portion 500 and the outer layer portion 600 is formed of a soft resin and the other is formed of a hard resin. In this case, although the response speed for an external stimulus is relatively high, a relatively large displacement is transferred to the sensor 400. That is, the response speed and the detection sensitivity can be adjusted to an intermediate level. Further, even when identical inner layer portions 500 are used, the response property can be adjusted for each of the sensing devices 200 by changing the outer layer portion 600 of each of the sensing devices 200. Likewise, even when identical outer layer portions 600 are used, the response property can be adjusted for each of the sensing devices 200 by changing the inner layer portion 500 of each of the sensing devices 200.

Figure 10:
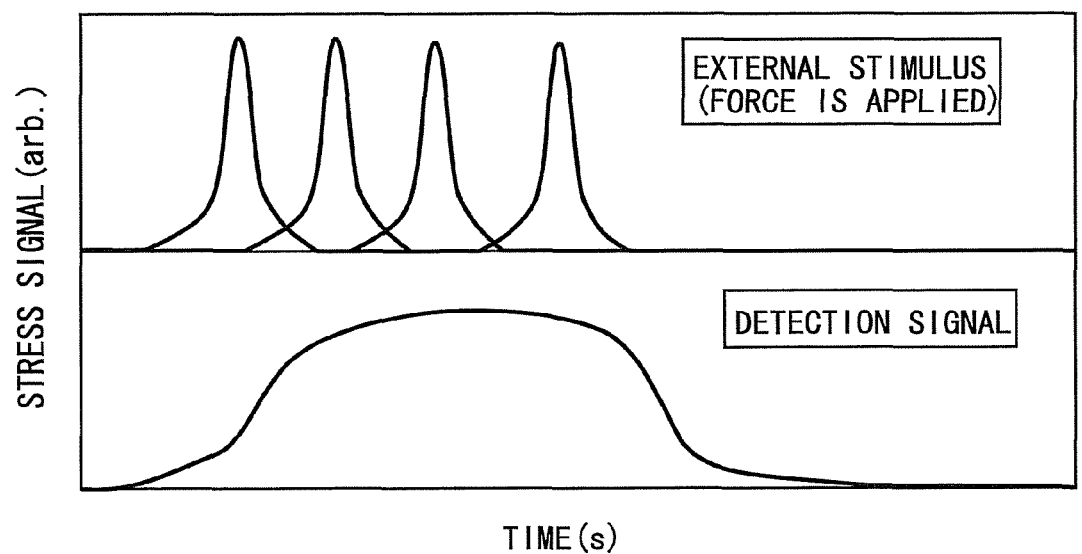
FIG. 10 is a schematic figure showing an example of detection signals when the combination of the hardness of an inner layer portion and the hardness of an outer layer portion is changed.

FIG. 10 is an example where: the inner layer portion 500 is formed of a soft resin; the outer layer portion 600 is formed of a hard resin; and a force is exerted in a successive-pulse fashion. The applied force is detected in such a state that it is averaged over position and time, thus enabling the detection signal to be simplified.

By changing the combination of the hardness of the inner layer portion 500 and that of the outer layer portion 600 as described above, it is possible to change the response speed and the detection sensitivity from one sensing device to another. In this way, it becomes possible to produce sensing devices 200 for various uses just by changing their inner layer portions 500 and outer layer portions 600, after the sensors 400 have been mass-produced.

[Second Exemplary Embodiment]

Figure 11:
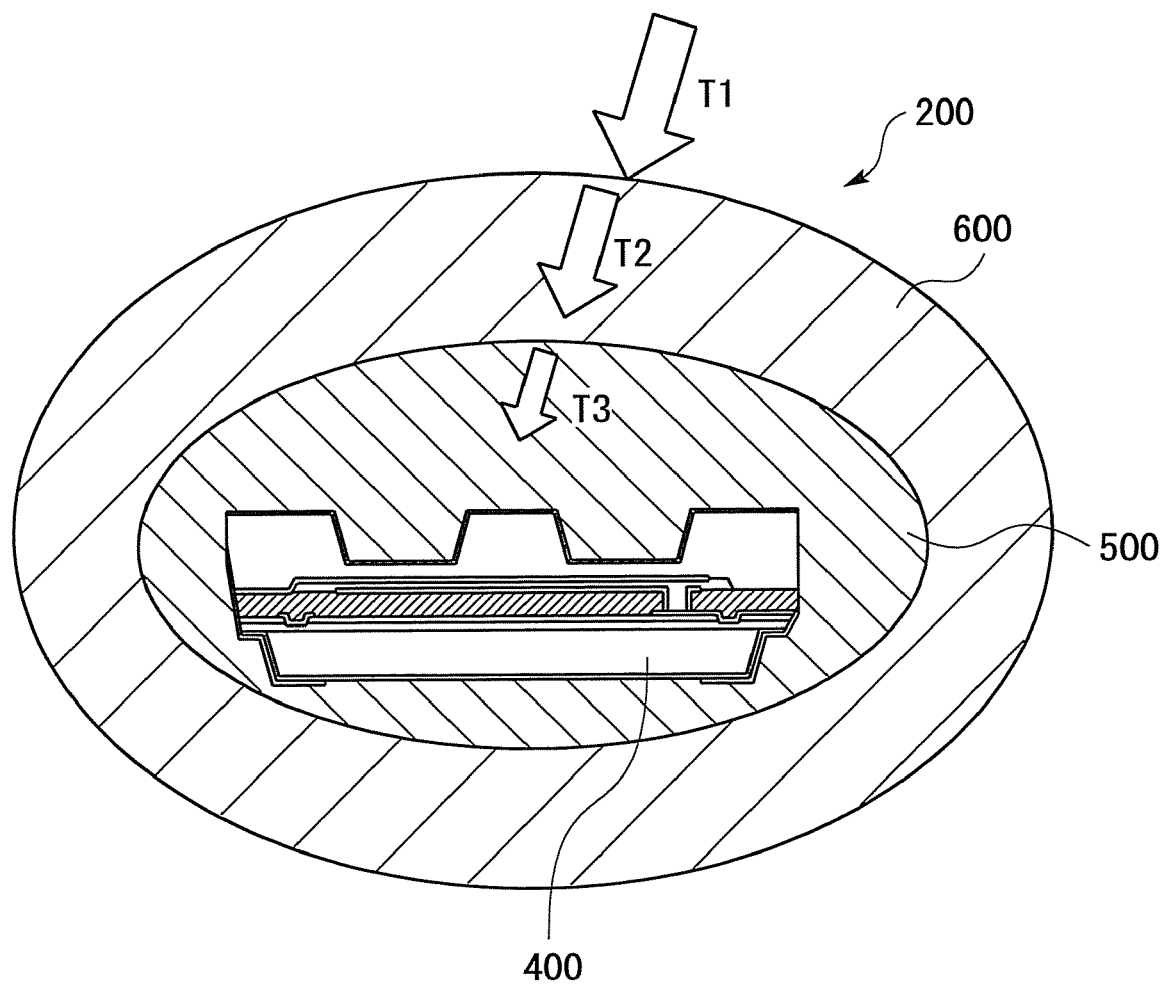
FIG. 11 is a schematic figure showing a second exemplary embodiment of a sensing device.
Figure 12:
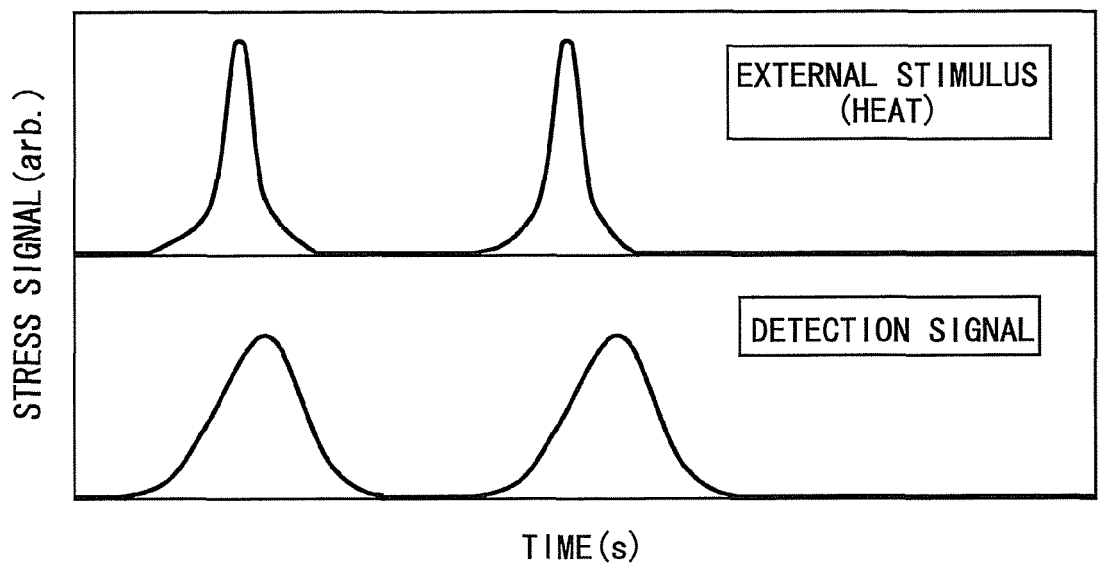
FIG. 12 is a schematic figure showing an example of detection signals when both an inner layer portion and an outer layer portion have a high thermal conductivity and a small specific heat.

As a second exemplary embodiment, a case where the temperature detection characteristic is changed by changing the thickness, thermal conductivity, and/or specific heat between the inner layer portion 500 and the outer layer portion 600 as shown in FIG. 11. FIG. 12 is a schematic figure showing an example where both the inner layer portion 500 and the outer layer portion 600 have a high thermal conductivity and a small specific heat. In this case, the temperature response property can be made faster.

Figure 13:
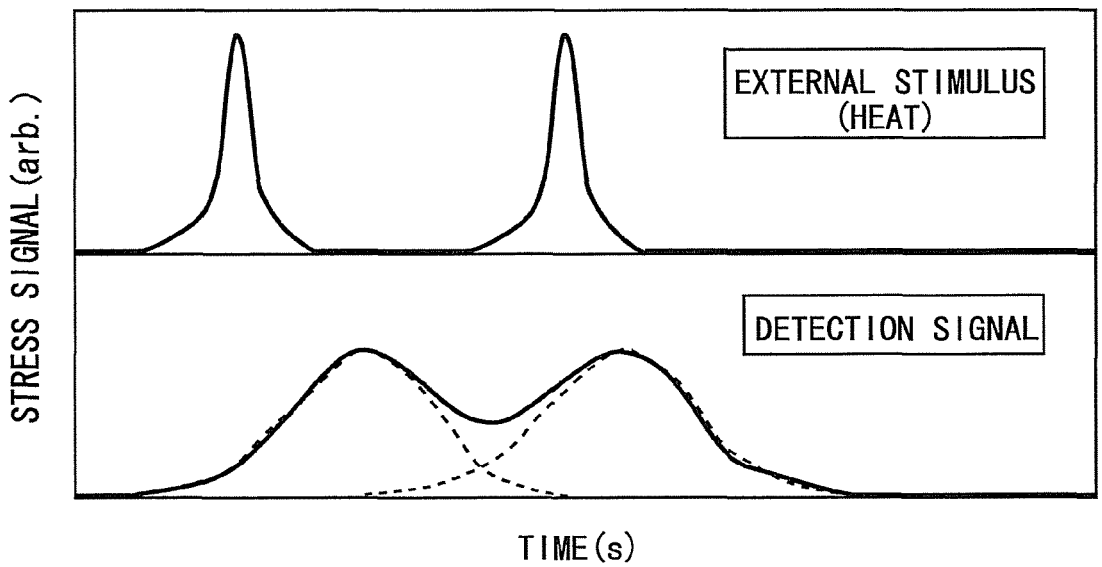
FIG. 13 is a schematic figure showing an example of detection signals when both an inner layer portion and an outer layer portion have a low thermal conductivity and a large specific heat.

FIG. 13 is an example where both the inner layer portion 500 and the outer layer portion 600 have a low thermal conductivity and a large specific heat. In this case, the temperature response property can be made slower.

Figure 14:
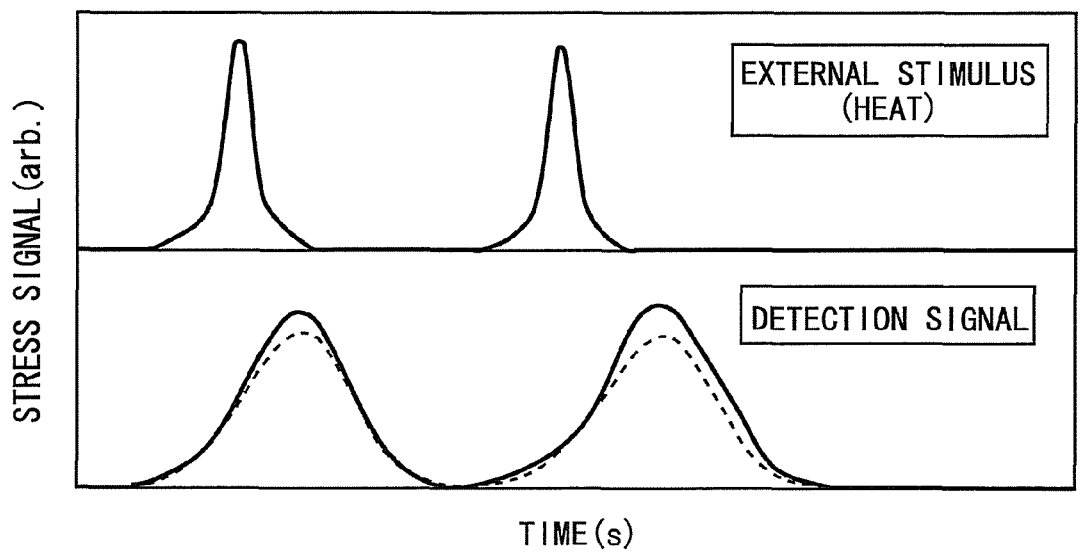
FIG. 14 is a schematic figure showing an example of detection signals when one of an inner layer portion and an outer layer portion has a low thermal conductivity and a large specific heat and the other has a high thermal conductivity and a small specific heat.

FIG. 14 is an example where one of the inner layer portion 500 and the outer layer portion 600 has a low thermal conductivity and a large specific heat and the other has a high thermal conductivity and a small specific heat. In this case, the temperature response property can be adjusted to an intermediate level.

Figure 15:
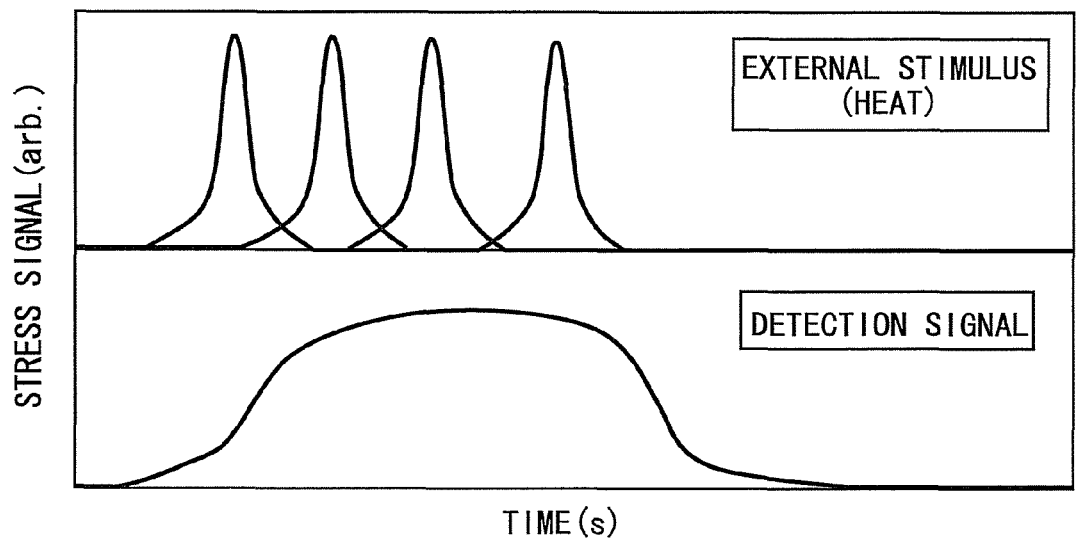
FIG. 15 is a schematic figure showing an example of detection signals when: an inner layer portion has a low thermal conductivity and a large specific heat; an outer layer portion has a high thermal conductivity and a large specific heat; and heat is applied in a successive-pulse fashion.

FIG. 15 is an example where: the inner layer portion 500 has a low thermal conductivity and a large specific heat; the outer layer portion 600 has a high thermal conductivity and a large specific heat; and heat is applied in a successive-pulse fashion. As shown in FIG. 15, in this case, heat can be detected in an averaged state.

As described above, by changing the combination of the thermal conductivity and/or the specific heat between the inner layer portion 500 and the outer layer portion 600, it becomes possible to change the response speed and the detection sensitivity of the sensing device. In this way, it becomes possible to produce sensing devices for various uses by changing their inner layer portions 500 and outer layer portions 600 after the sensors 400 have been mass-produced.

[Third Exemplary Embodiment]

Figure 16:
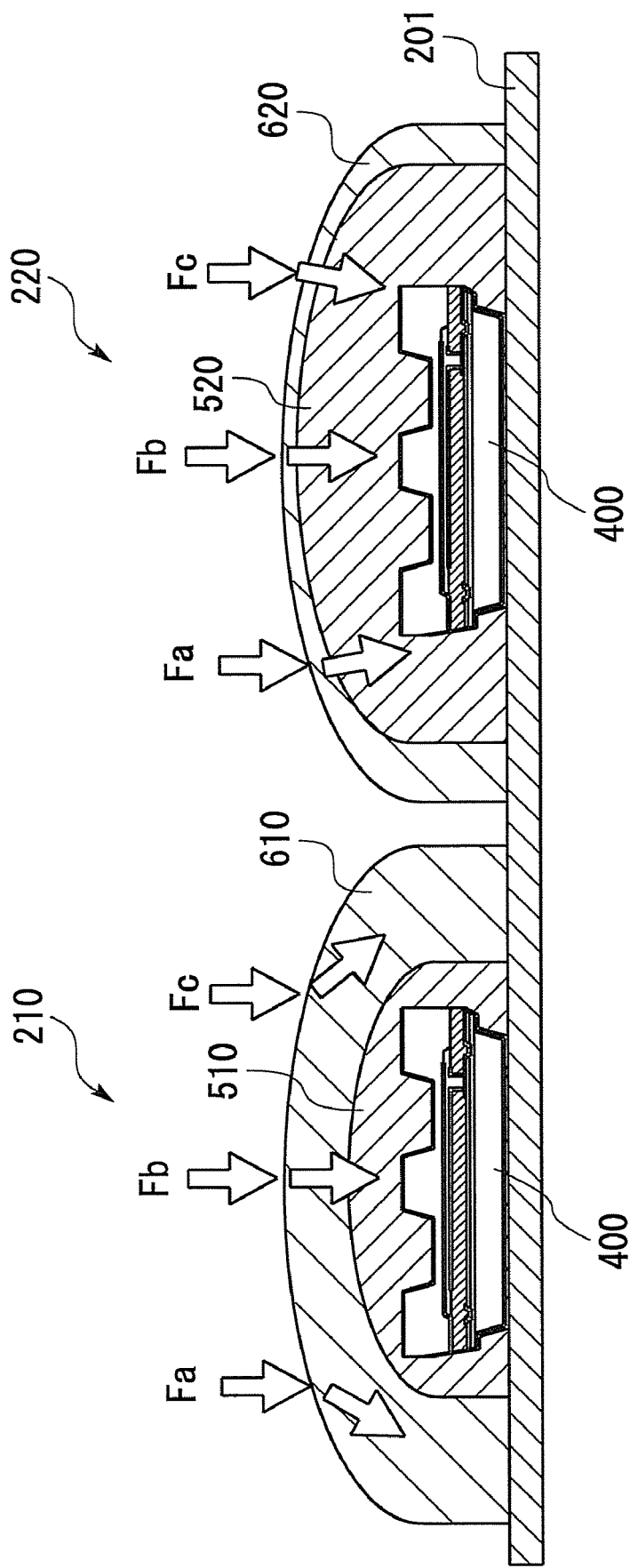
FIG. 16 is a schematic figure showing an example where two sensing devices are combined.

Next, a case where sensing devices having different detection characteristics from each other are combined is explained. FIG. 16 is an example where two sensing devices are combined. Note that in the example shown in FIG. 16, each of the sensing devices is formed into such a shape that the bottom is flattened. Further, the bottom portion 201 is formed of hard material, and the outer layer portion does not entirely cover the inner layer portion 500 but does cover only the upper-surface side of the inner layer portion 500.

In FIG. 16, the sensing device on the left side would be referred to as "first sensing device 210" and the sensing device on the right side would be referred to as "second sensing device 220". The first sensing device 210 includes a soft and thick outer layer portion 610 and a hard and thin inner layer portion 510. It is assumed that external forces Fa, Fb and Fc are applied to the outer surface of this first sensing device 210 as shown in FIG. 16. As a result, although Fb is detected by the sensor 400, Fa and Fc are diverted to the outside of the sensor 400 and thereby are not detected by the sensor 400. In this way, the first sensing device 210 selectively detects the force Fb applied at or near the center. Since the first sensing device 210 has its detection area only at or near the center as described above, the first sensing device 210 is suitable for detecting unevenness of a corner and/or surface of an object to be measured, its degree of roughness, and the like.

The second sensing device 220 includes a soft and thin outer layer portion 620 and a hard and thick inner layer portion 520. It is asumed that external forces Fa, Fb and Fc are applied to the outer surface of this second sensing device 220. In the second sensing device 220, Fa and Fc as well as Fb are transferred to the sensor 400. Therefore, the second sensing device 220 detects not only the force Fb applied at or near the center but also the forces Fa and Fc applied to the peripheral area. Since the second sensing device 220 detects not only a force applied at or near the center but also a force applied to any part of the whole area as described above, the second sensing device 220 is suitable for detecting an overall characteristic, such as a weight and hardness, of an object to be measured.

As shown in FIG. 16, by associating the first sensing device 210 and the second sensing device 220 by arranging them side by side, each of the weight, hardness, shape, and surface condition of an object to be measured can be detected and/or determined. As a result, the object to be measured may be selectively determined.

For example, both a plastic bottle and a glass bottle are roundish and have a smooth surface with no or few corners. However, they are different in the hardness. By associating the first sensing device 210 and the second sensing device 220, it becomes possible to distinguish between the plastic bottle and the glass bottle by detecting the difference in the hardness between them.

Further, although both a pumpkin and a (root of) turnip have similar hardness and weight, their surface shapes are different. That is, the pumpkin has an uneven surface while the turnip has a smooth surface. The difference in the surface shape like this can be also detected by associating the first sensing device 210 and the second sensing device 220.

Note that the thickness of the first sensing device 210 is preferably same with the thickness of the second sensing device 220. In other words, the maximum total thickness of the outer layer portion 610 and the inner layer portion 510 is preferably same with the maximum total thickness of the outer layer portion 620 and the inner layer portion 520. By adopting this configuration, the first sensing device 210 and the second sensing device 220 have the same height as viewed from an object to be measured. Therefore, an object to be measured comes into contact with the two sensing devices 210 and 220 simultaneously. As a result, it becomes possible to prevent such a situation that a contact force is transferred to only one of them, and thereby erroneous detections are being prevented.

[Fourth Exemplary Embodiment]

Figure 17:
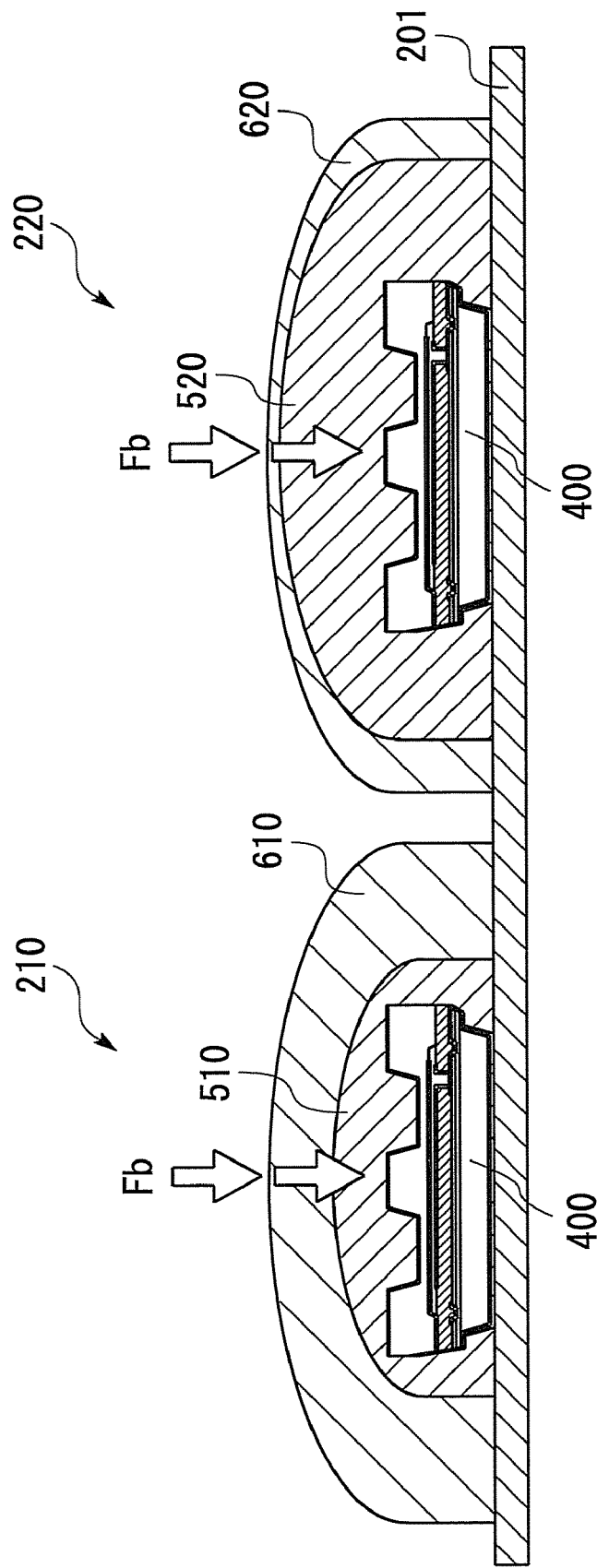
FIG. 17 is a schematic figure showing a fourth exemplary embodiment.
Figure 18:
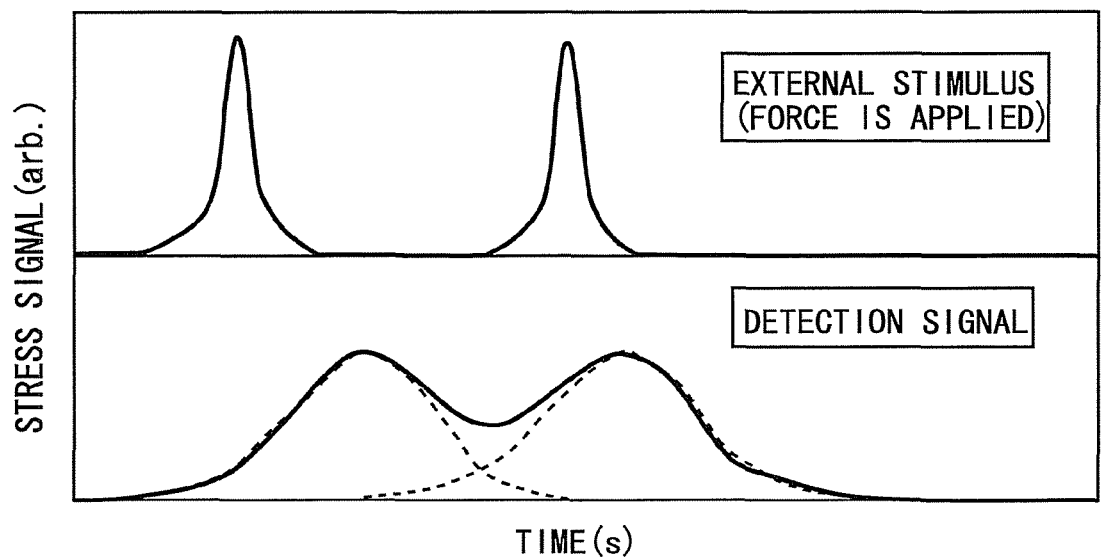
FIG. 18 is a schematic figure showing a response of a first sensing device in a fourth exemplary embodiment.

Next, the explanation is continued with reference to FIG. 17. In FIG. 17, the first sensing device 210 has an outer layer portion 610 formed of a hard and thick resin and an inner layer portion 510 formed of a hard and thin resin. Here, the term "hard" means material having a moderate elastic constant and a moderate dumping factor. In this case, the first sensing device 210 has a slow detection response speed for an external stimulus (see FIG. 18). Therefore, the first sensing device 210 detects an average force applied by an object to be measured and/or the weight of the object to be measured.

Figure 19:
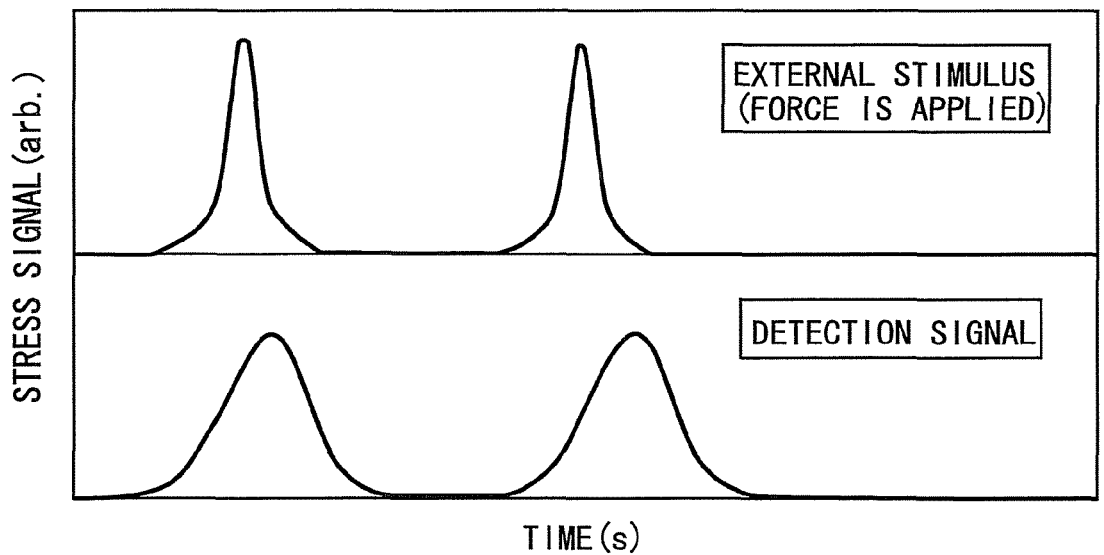
FIG. 19 is a schematic figure showing a response of a second sensing device in a fourth exemplary embodiment.

The second sensing device 220 has an outer layer portion 620 formed of a hard and thin resin and an inner layer portion 520 formed of a hard and thick resin. In this case, the second sensing device 220 has a fast detection response speed for an external stimulus (see FIG. 19). Therefore, the second sensing device 220 can detect a corner, unevenness, the degree of roughness, and the like that are sensed when, for example, the robot 10 touches an object to be measured while moving its finger(s).

By associating the first sensing device 210 and the second sensing device 220 as shown in FIG. 17, it becomes possible to selectively detect a force that changes slowly over time and a force that changes quickly over time. In this way, it becomes possible to determine the quality of material, processed shape, and/or surface condition of an object to be measure, and thereby to determine the object to be measure.

For example, both an apple and a pear have similar weight and hardness. However, they have such a difference that the apple has a smooth surface while the pear has a rough surface. Therefore, when the sensing devices 210 and 220 are brought into contact with the surface of a pear in such a manner the sensing devices 210 and 220 are rubbed against the pear, a vibration force, which occurs only in the case of an object having a rough surface such as a pear, is detected by the second sensing device 220. When the second sensing device 220 detects this vibration having a high frequency, it can determine that the object to be measure is a pear.

Further, although both an apple and a tomato have a smooth surface, they are different in the softness. Therefore, when being rubbed, if the vibration having a characteristic high frequency is not detected as in the case of the apple but a large displacement is detected, it can be determined that the object to be measure is a tomato.

[Fifth Exemplary Embodiment]

Figure 20:
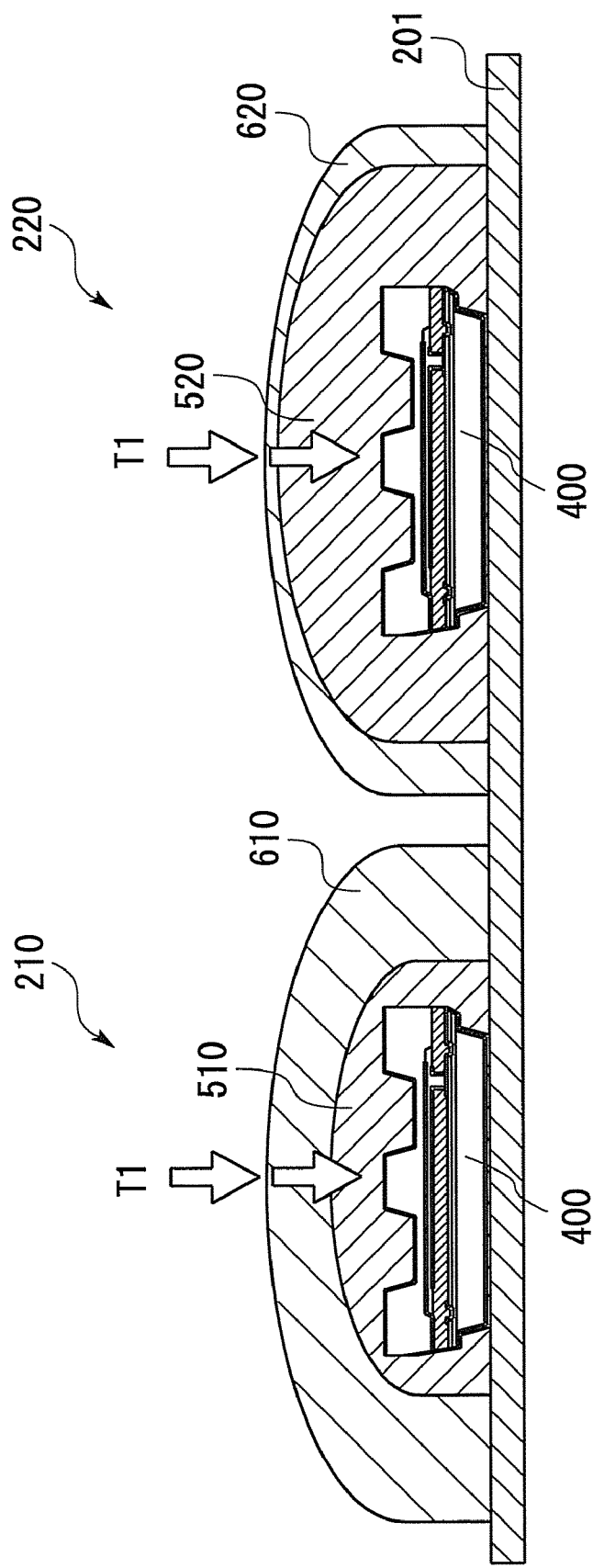
FIG. 20 is a schematic figure showing a fifth exemplary embodiment.

Next, the explanation is continued with reference to FIG. 20. In

Figure 21:
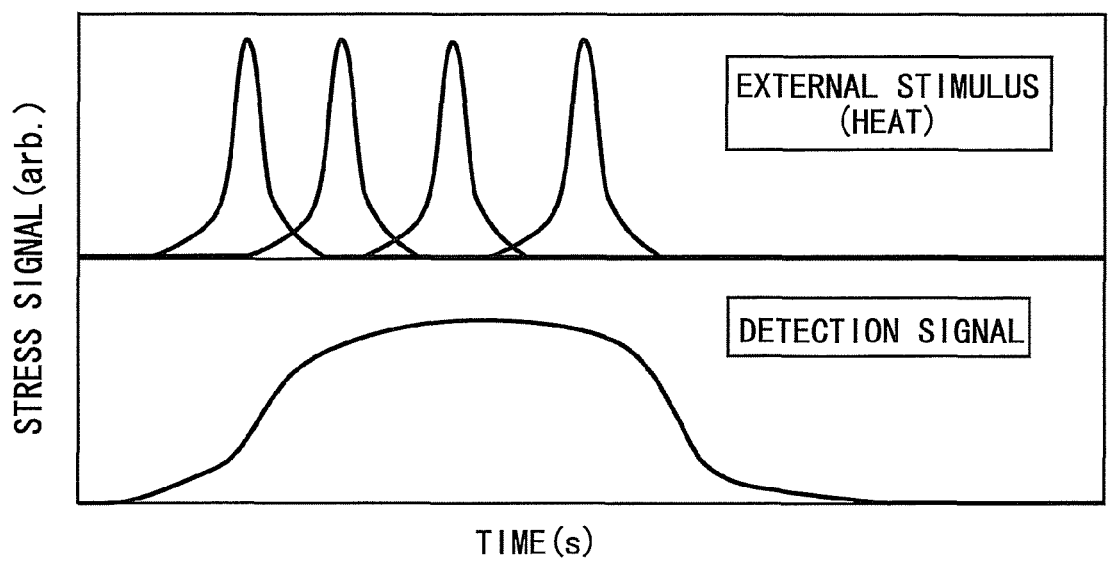
FIG. 21 is a schematic figure showing a response of a first sensing device in a fourth exemplary embodiment.

FIG. 20, the outer layer portion 610 of the first sensing device 210 is thick, and has a low thermal conductivity and a large heat capacity. Meanwhile, the inner layer portion 510 of the first sensing device 210 is thin, and has a high thermal conductivity and a small heat capacity. In this case, the temperature response property of the first sensing device 210 becomes slower. As a result, even when the contact with an object to be measure is continuously repeated or when the temperature of an object to be measure varies in a short time, the first sensing device 210 detects a temperature that is obtained by averaging the contact with the object to be measure (see FIG. 21). In this way, it is possible to reduce the influence of the temperature change due to a vibration caused by a wind or the like.

Figure 22:
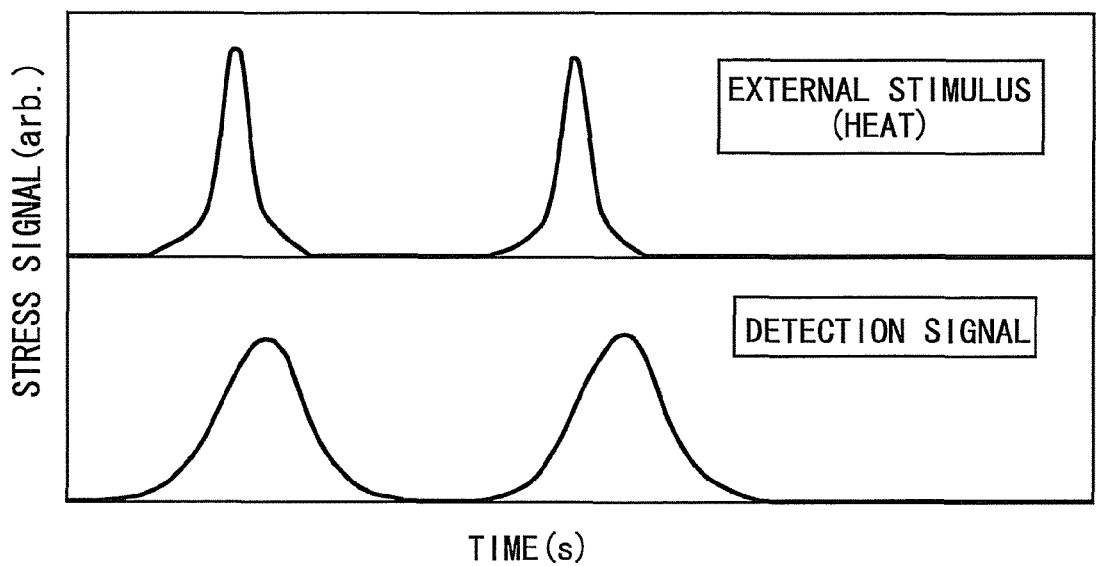
FIG. 22 is a schematic figure showing a response of a second sensing device in a fifth exemplary embodiment.

The outer layer portion 620 of the second sensing device 220 is thin, and has a low thermal conductivity and a large heat capacity. Meanwhile, the inner layer portion 520 of the second sensing device 220 is thick, and has a high thermal conductivity and a small heat capacity. In this case, the temperature response property of the second sensing device 220 becomes faster, thus making it possible to detect a temperature change that occurs in a short time (see FIG. 22) As a result, the second sensing device 220 can detect, for example, the flow of heat.

By associating the first sensing device 210 and the second sensing device 220 as shown in FIG. 20, each of a temperature change that occurs slowly over time and a temperature change that occurs quickly over time. Therefore, it is possible to detect the temperature, the quality of material, and/or the thermal magnitude of the object to be measured.

For example, for a wooden block and an iron block, the speed at which the temperature is transferred and the time for which the temperature is kept are different between them even when they are initially at the same temperature. When the hand 11 of the robot 10 touches a wooden block, the temperature detected by the second sensing device 220 rises slowly. In contrast to this, when the hand 11 of the robot 10 touches an iron block, the temperature detected by the second sensing device 220 rises sharply. On the other hand, with regard to the first sensing device. 210, the difference between when the object to be measure is wood and when the object to be measure is iron is small, and the detected temperature rises slowly in both of the cases. By associating the first sensing device 210 and the second sensing device 220, it is possible to determine the temperature, thermal conductivity, and/or heat capacity of an object to be measure and thereby to determine the object to be measure.

[Sixth Exemplary Embodiment]

Figure 23:
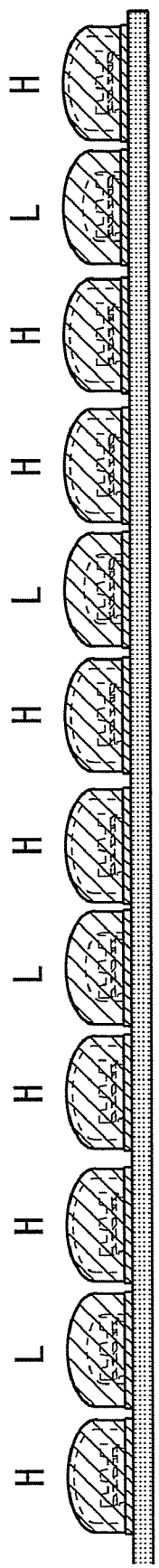
FIG. 23 is a schematic figure showing an example where sensing devices having different detection characteristics from each other are arranged in a one-dimensional fashion.
Figure 24:
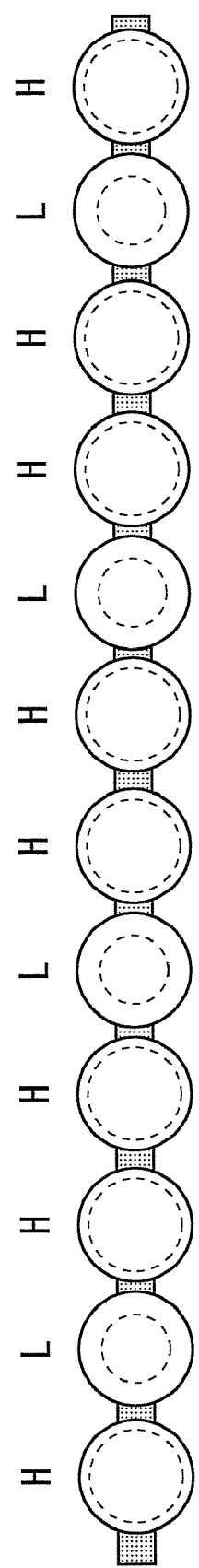
FIG. 24 is a schematic figure showing an example where sensing devices having different detection characteristics from each other are arranged in a one-dimensional fashion.

As a sixth exemplary embodiment, an arrangement pattern in which sensing devices having different detection characteristics are arranged is explained. FIGS. 23 and 24 show a case where sensing devices having different detection characteristics are arranged in a one-dimensional fashion. FIG. 23 shows a side view and FIG. 24 shows a plane view. Note that a sensing device having a faster detection speed is represented as "H-type" and a sensing device having a slower detection speed is represented as "L-type". When H-type sensing devices and L-type sensing devices are arranged in a one-dimensional fashion, they are arranged as "HLH, HLH, HLH, . . . ".

Since the H-type sensing device has a fast response speed, it has a high spatial resolution. In contrast to this, since the L-type sensing device has a slow response speed, it has a low spatial resolution. Therefore, the spatial resolution can be improved by increasing the number of the H-type sensing devices. On the other hand, since each of the L-type sensing devices can detect a larger space, the number of the L-type sensing devices may be smaller than that of the H-type devices. Therefore, when H-type sensing devices and L-type sensing devices are arranged, the above-described arrangement pattern is effective, that is the HLH arrangement is effective.

Figure 25:
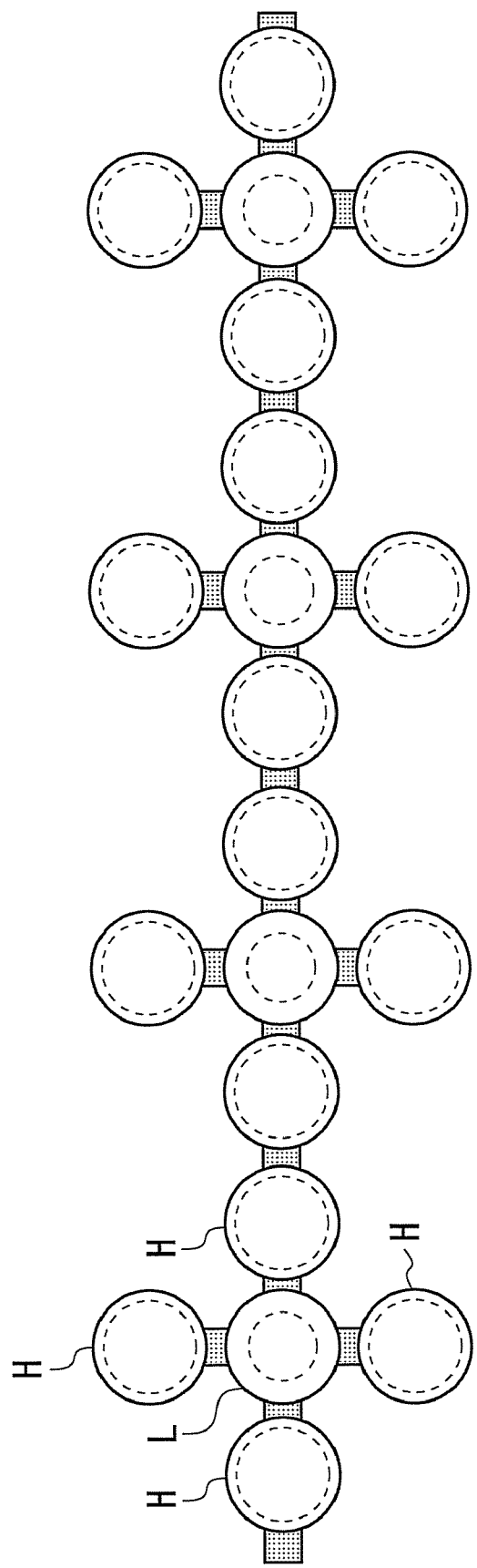
FIG. 25 is a schematic figure showing an example where a vertical width is added to a one-dimensional array.

FIG. 25 is a schematic figure showing a case where a vertical width is added to the above-described one-dimensional array. This array is referred to as "1.5-dimensional array". In this case, H-type sensing devices may be added in such a manner that each L-type sensing device of the above-described one-dimensional array is surrounded by H-type sensing devices on the four sides. In this way, the spatial resolution in the width direction can be added.

Figure 26:
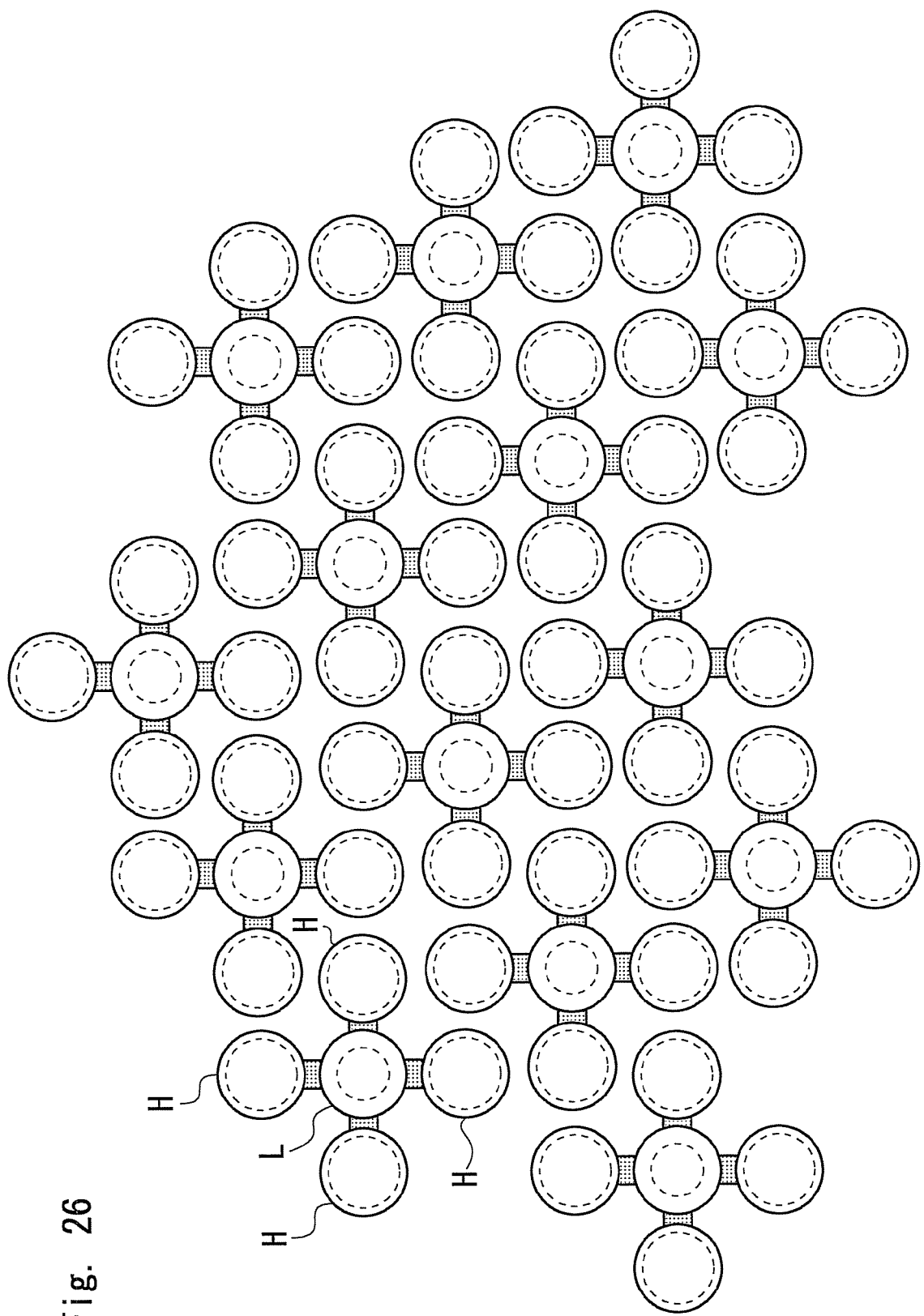
FIG. 26 is a schematic figure showing an example where sensing devices having different detection characteristics from each other are arranged in a two-dimensional fashion.

FIG. 26 is a schematic figure showing a case where sensing devices having different detection characteristics are arranged in a two-dimensional fashion. In FIG. 26, units of sensing devices each composed of five sensing devices, i.e., one L-type sensing device at the center and four H-type sensing devices on the four sides are arranged.

Figure 27:
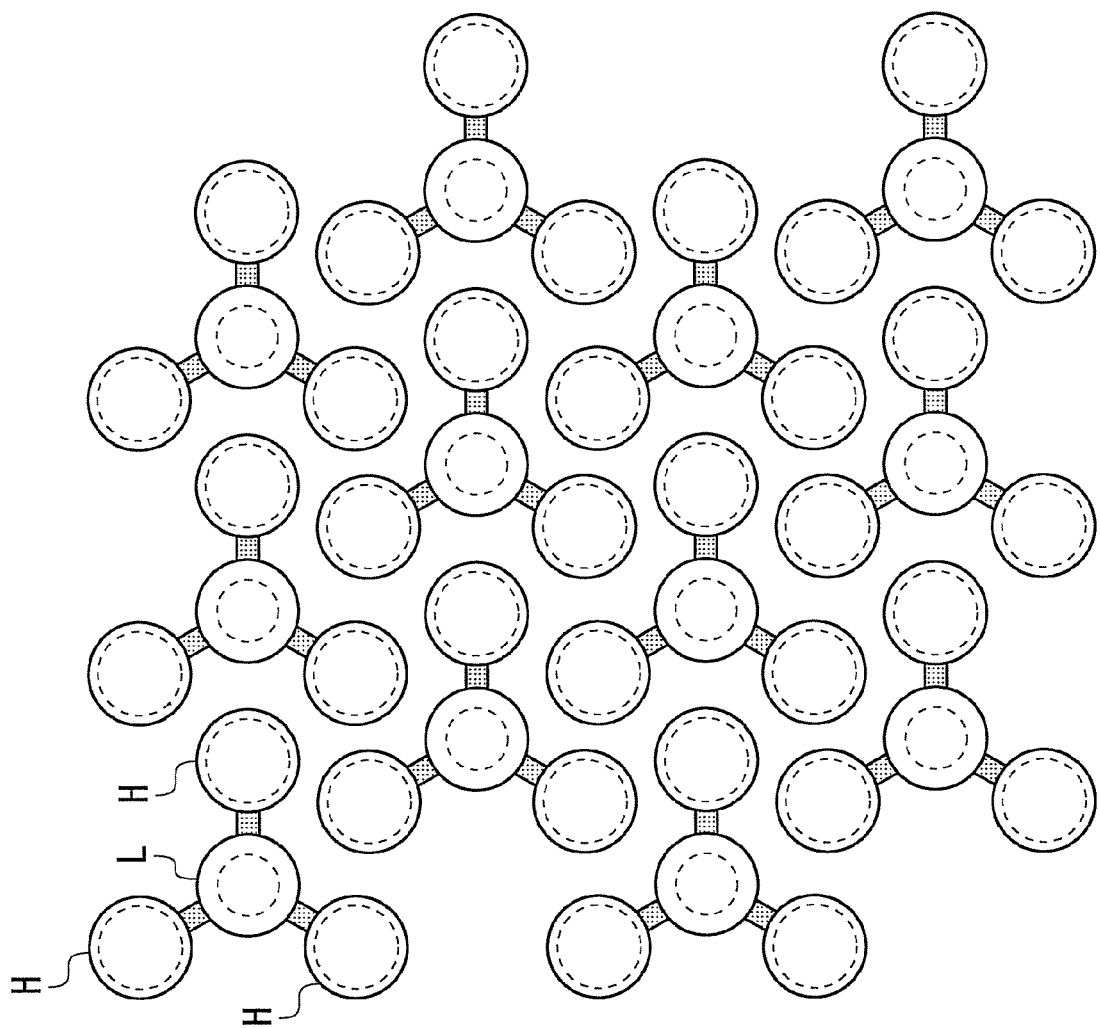
FIG. 27 is a schematic figure showing an example where sensing devices having different detection characteristics from each other are arranged in a two-dimensional fashion.

Further, when the sensing devices are arranged in the planar arrangement, they may be arranged as shown in FIG. 27. In FIG. 27, units of sensing devices each composed of four sensing devices, i.e., one L-type sensing device at the center and three H-type sensing devices on the three sides are arranged. With the configuration like this, the spatial resolution can be improved even further by using detection results obtained by mutually neighboring units.

[Seventh Exemplary Embodiment]

Figure 28:
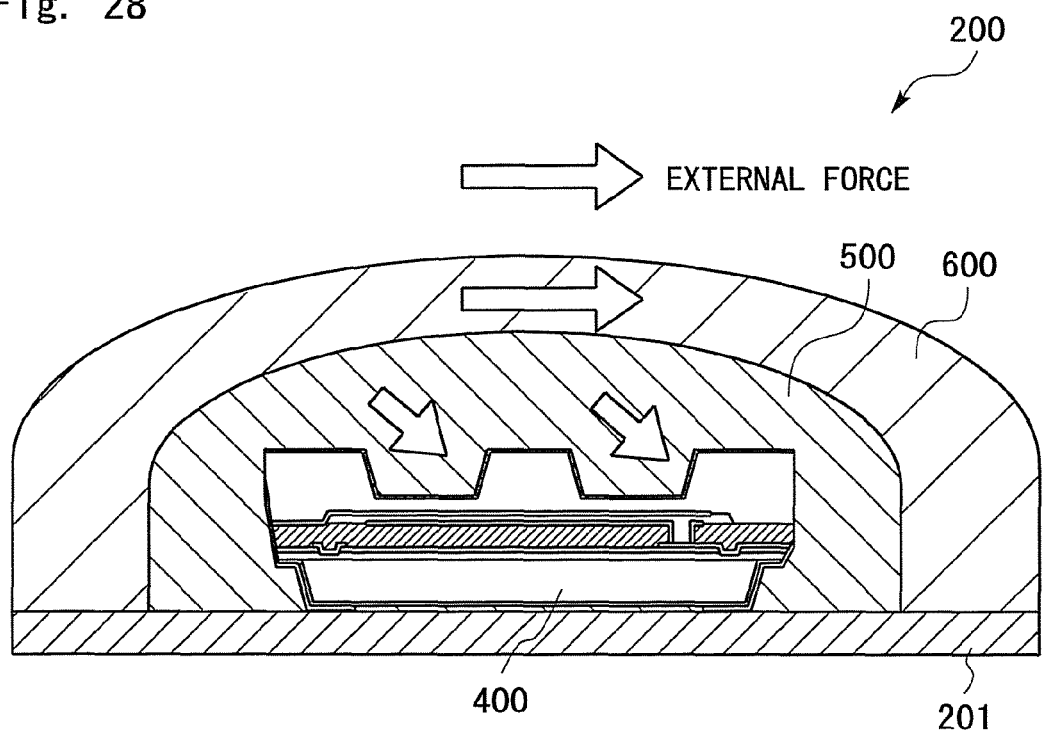
FIG. 28 is a schematic figure showing a case where a tangential stress is applied on the outer surface of a sensing device 200.

As a seventh exemplary embodiment, in a case where a tangential stress (such as a shearing stress and a shearing force) is applied on the outer surface of a sensing device, why this tangential stress can be detected is explained. FIG. 28 is a schematic figure showing a case where a tangential stress is applied on the outer surface of a sensing device 200. When a tangential stress is applied on the outer surface of a sensing device 200, the outer layer portion 600 and the inner layer portion 500 is deformed in the direction of the tangential stress. Further, since unevenness is formed on the surface of the sensor 400, the applied force has a vertical stress component when the force is transferred from the inner layer portion 500 to the surface of the sensor 400. Therefore, the sensor 400 can detect the tangential stress applied on the outer surface.

Figure 29:
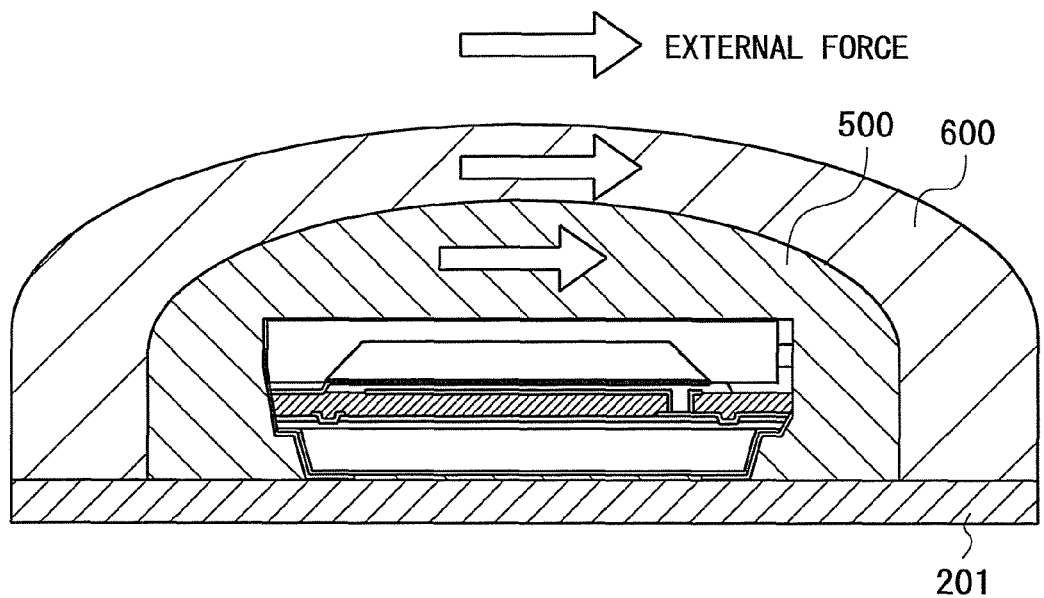
FIG. 29 is a figure for comparative explanation.

FIG. 29 is a figure for comparative explanation. FIG. 29 is a schematic figure showing a case where the surface of the sensor is flat. If there is not any unevenness on the surface of the sensor, a force that is applied in a direction substantially parallel to the outer surface is transferred to the sensor surface in the parallel direction. Therefore, the sensor cannot detect this force.

Further, since a force is repeatedly applied to the sensing device 200, the sensing device 200 is required to have quite high durability. As for this matter, since the sensor has unevenness on its surface, the peeling stress that is applied between the inner layer portion 500 and the surface of the sensor is reduced. Therefore, the separation between the inner layer portion 500 and the sensor 400 becomes less likely to occur. Therefore, the durability of the sensing device 200 is dramatically improved, thus significantly improving the reliability.

Note that although a case where a force is detected is explained in the above explanation, the provision of unevenness on the surface of the sensor 400 is also effective when the detection target is heat. When heat is applied to the outer surface, the heat transfer from the inner layer portion is significantly improved by forming the unevenness on the surface of the sensor. As a result, it is possible to measure the heat with an excellent response property and high accuracy.

[Eighth Exemplary Embodiment]

Figure 30:
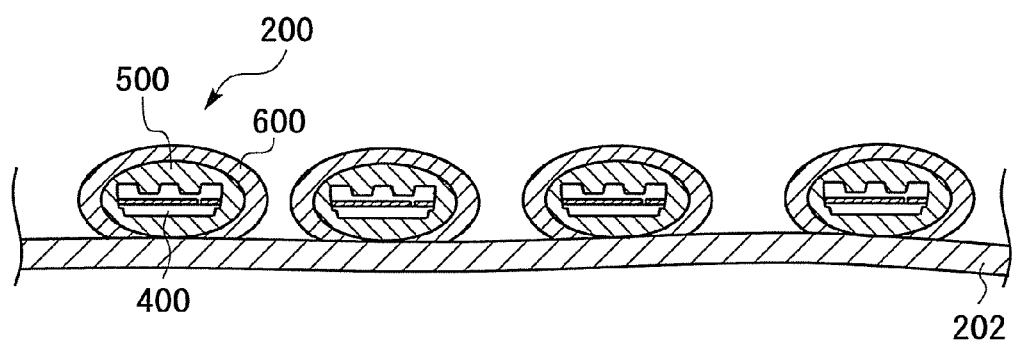
FIG. 30 is a schematic figure showing an installation manner of a sensing device in accordance with eighth exemplary embodiment.

Next, an installation manner of a sensing device is explained. In FIG. 30, a plurality of sensing devices 200 are disposed on a sheet 202. The sheet 202 is formed of a pliable resin. Note that each of the sensing devices 200 is completely separated from and independent of each other. That is, each of the sensing devices 200 includes an independent inner layer portion 500 and an outer layer portion 600, and neighboring sensing devices use neither a common inner layer portion 500 nor a common outer layer portion 600.

Further, when attention is focused on the outer surface of an individual sensing device 200 in FIG. 30, the entire outer surface of the outer layer portion 600, except for the portion in which the outer layer portion 600 is bonded to the sheet 202, can be brought into contact with the outside. With the configuration like this, the area of the outer surface of the outer layer portion 600 that can be brought into contact with the outside becomes larger, thus increasing the sensing area of each of the sensing devices 200.

Figure 31:
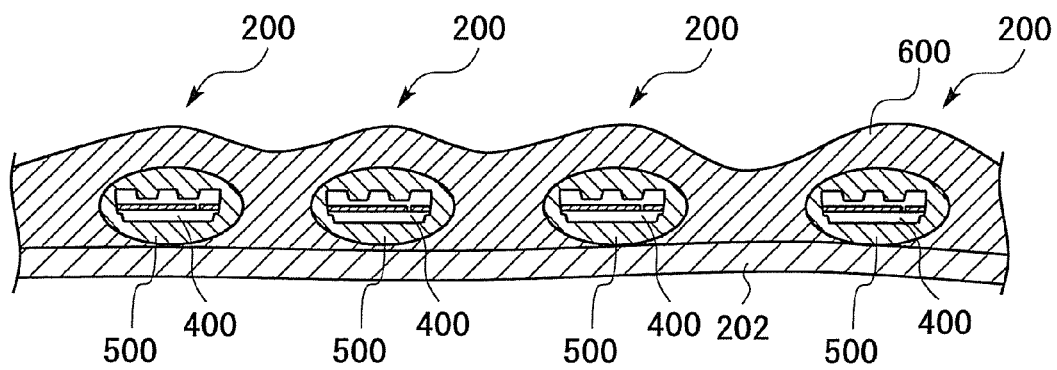
FIG. 31 is a schematic figure showing an installation manner of a sensing device in accordance with eighth exemplary embodiment.

Next, in FIG. 31, a plurality of sensing devices 200 are disposed on a sheet 202. Note that the plurality of sensing devices 200 use a common outer layer portion 600. That is, the sensors 400 wrapped in the inner layer portions 500 are disposed on the sheet 202, and an outer layer portion 600 is formed so as to fill up the gap. With the configuration like this, the sensing device 200 is less likely to be detached from the sheet 202, thus improving the stability.

Figure 32:
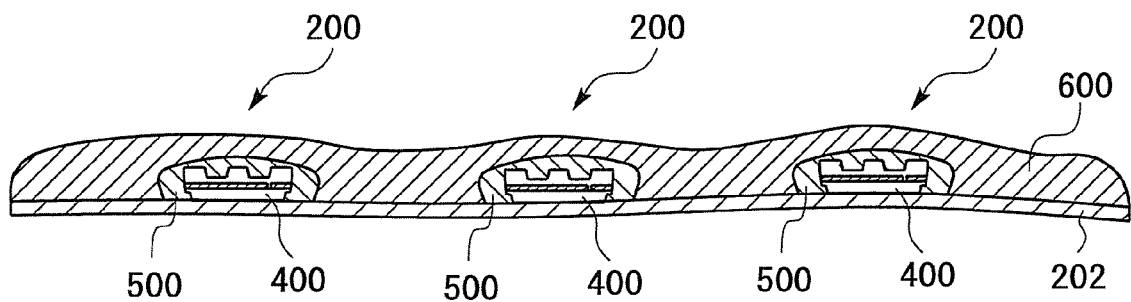
FIG. 32 is a schematic figure showing an installation manner of a sensing device in accordance with eighth exemplary embodiment.
Figure 33:
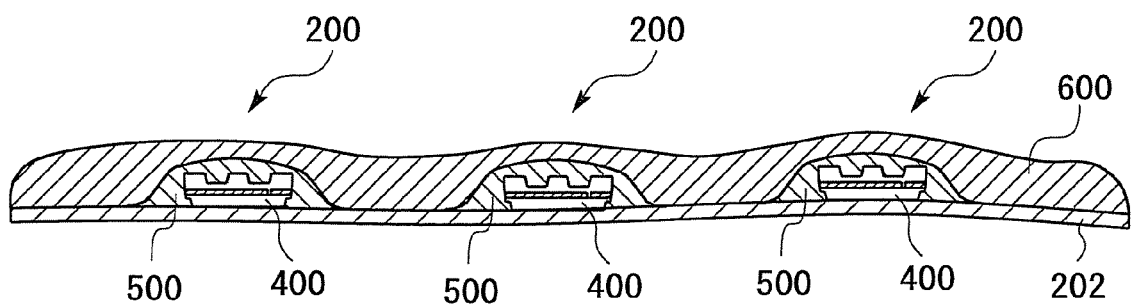
FIG. 33 is a schematic figure showing an installation manner of a sensing device in accordance with eighth exemplary embodiment.
Figure 34:
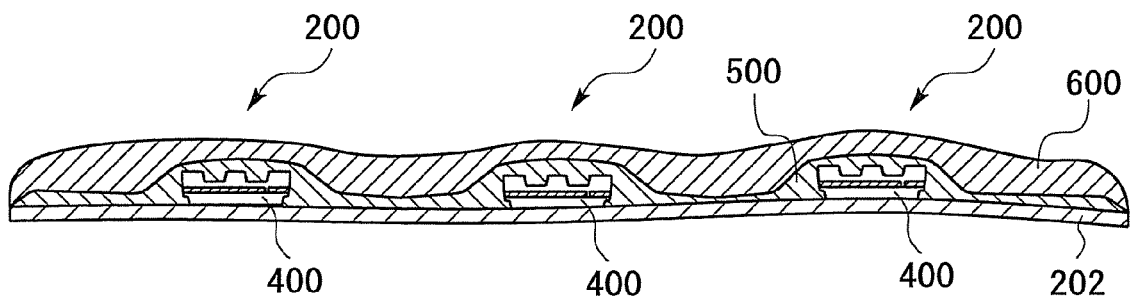
FIG. 34 is a schematic figure showing an installation manner of a sensing device in accordance with eighth exemplary embodiment.

Further, forms of installation as shown in FIGS. 32, 33 and 34 may be also employed. In FIG. 32, sensing devices 400 are disposed on a sheet 202, and an inner layer portion 500 is formed on a respective one of the sensing devices 400. Then, an outer layer portion 600 is formed so as to fill up the gap. In FIG. 33, when inner layer portions 500 are formed, each of the inner layer portions 500 is formed in such a manner that the bottom of the inner layer portion 500 becomes wider so that the bonding area between the sheet 202 and the inner layer portion 500 becomes larger. In FIG. 34, the inner layer portion 500 is not isolated for each sensor 400, and is formed so as to cover a plurality of sensing devices 400.

[Ninth Exemplary Embodiment]

Figure 35:
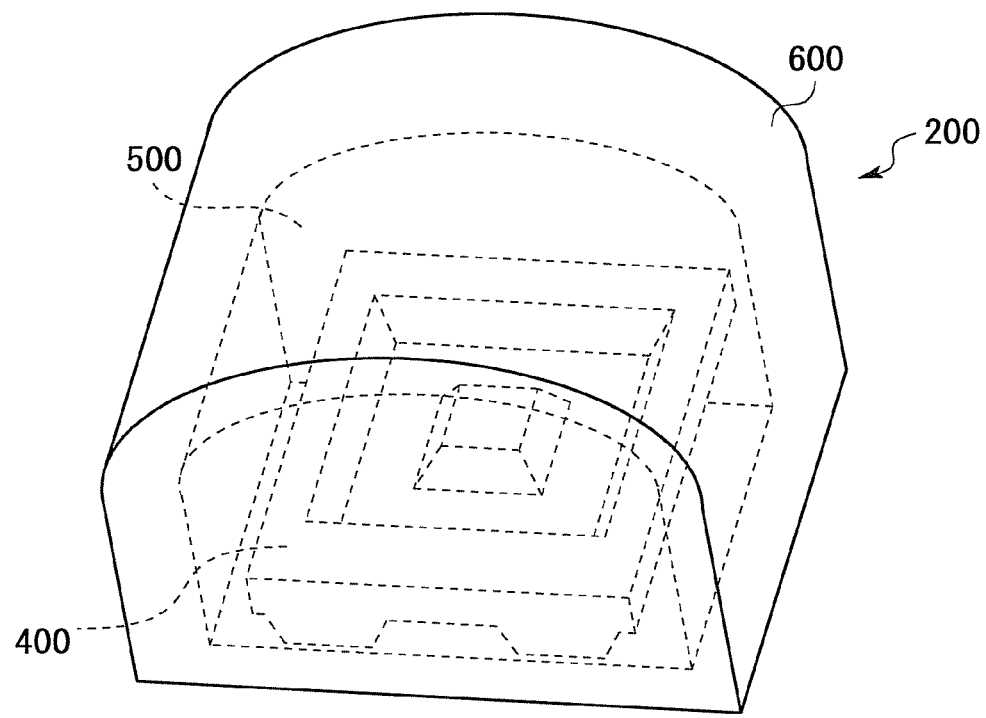
FIG. 35 is a schematic figure showing an example of a shape of a sensing device in accordance with ninth exemplary embodiment.

Next, a pattern of a shape of a sensing device is explained. In FIG. 35, the inner layer portion 500 and the outer layer portion 600 of a sensing device 200 are formed into a semi-cylindrical shape. That is, they are formed in such a manner that the central portion of the upper surface becomes the highest portion and it is inclined toward the both ends in an arc shape. Note that the sides are preferably formed as vertical flat surfaces. By forming each of the sensing devices 200 in the shape like this, the sensing devices 200 can be easily arranged in a row.

Figure 36:
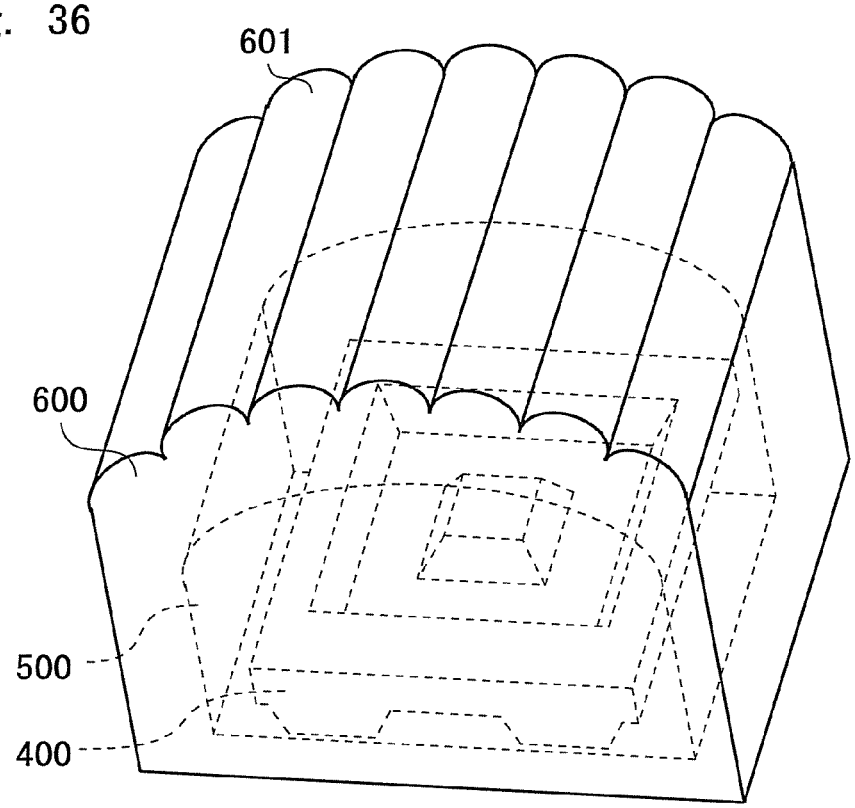
FIG. 36 is a schematic figure showing an example of a shape of a sensing device in accordance with ninth exemplary embodiment.

In FIG. 36, streak-like protrusions 601 are formed on the outer surface of the outer layer portion 600. Only one streak-like protrusion 601 may be provided in one sensing device 200, or a plurality of streak-like protrusions 601 may be provided so as to cover the outer surface as shown in FIG. 36. With the configuration like this, a large friction force is obtained against an object to be measure, thus providing resistance to the sliding. Further, when the sensing device 200 and an object to be measure are moved relative to each other while they are in contact with each other, a one-directional vibration occurs in the streak-like protrusion 601. In this way, it is possible to detect the surface condition, such as roughness and undulation, of the object to be measure with a high resolution.

Figure 37:
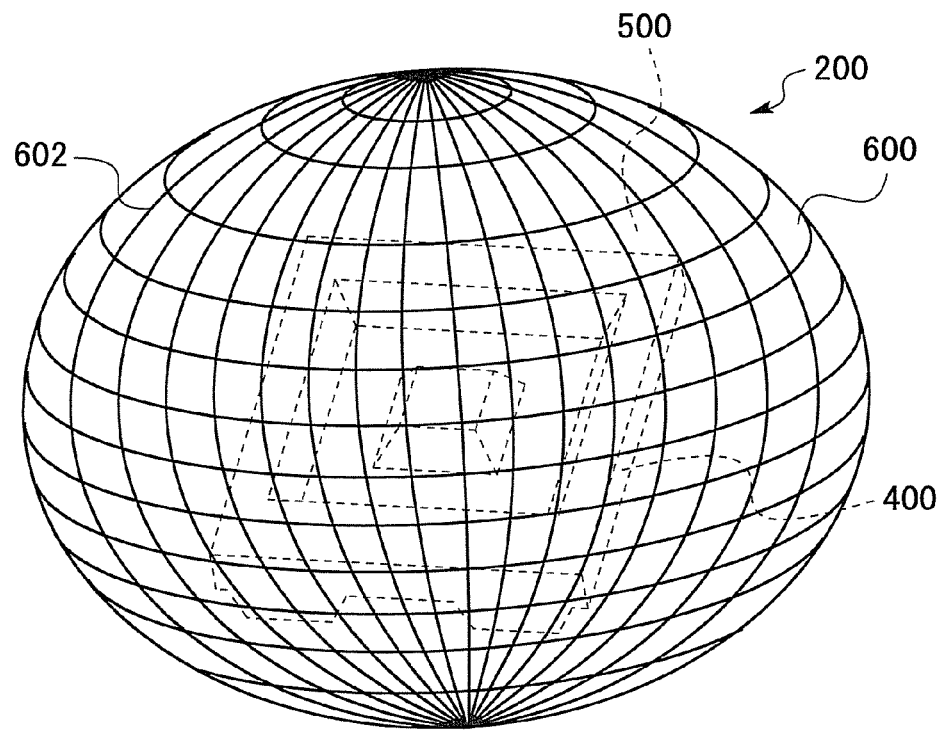
FIG. 37 is a schematic figure showing an example of a shape of a sensing device in accordance with ninth exemplary embodiment.

In FIG. 37, a plurality of columnar protrusions 602 are formed on the outer surface of the outer layer portion 600. The columnar protrusions 602 may be arranged in a lattice pattern. When the sensing device 200 and an object to be measure are moved relative to each other while they are in contact with each other, a vibration occurs in the columnar protrusions 602. In this way, it is possible to detect the surface condition, such as roughness and undulation, of the object to be measure with a high resolution.

Figure 38:
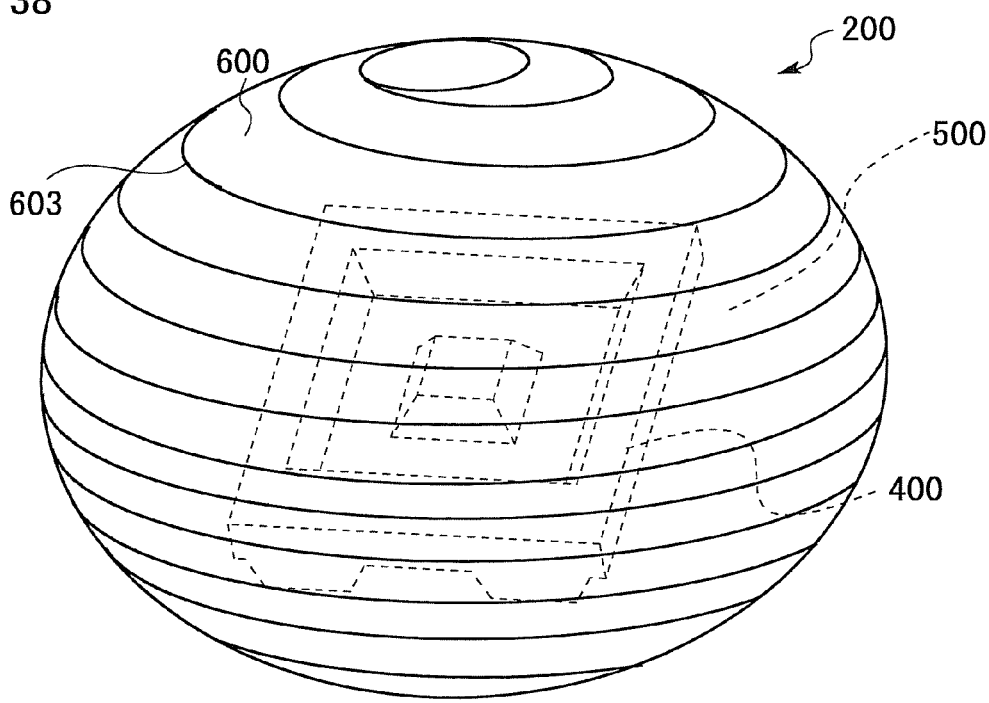
FIG. 38 is a schematic figure showing an example of a shape of a sensing device in accordance with ninth exemplary embodiment.

In FIG. 38, concentric or spiral streak-like protrusions 603 are provided on the outer surface of the outer layer portion 600. When the sensing device 200 and an object to be measure are moved relative to each other while they are in contact with each other, a vibration occurs in the streak-like protrusions 603. In this way, it is possible to detect the surface condition, such as roughness and undulation, of the object to be measure with a high resolution. With this configuration, a uniform friction force can be produced irrespective of the direction of the relative movement in comparison to when columnar protrusions are arranged in a lattice pattern.

Figure 39:
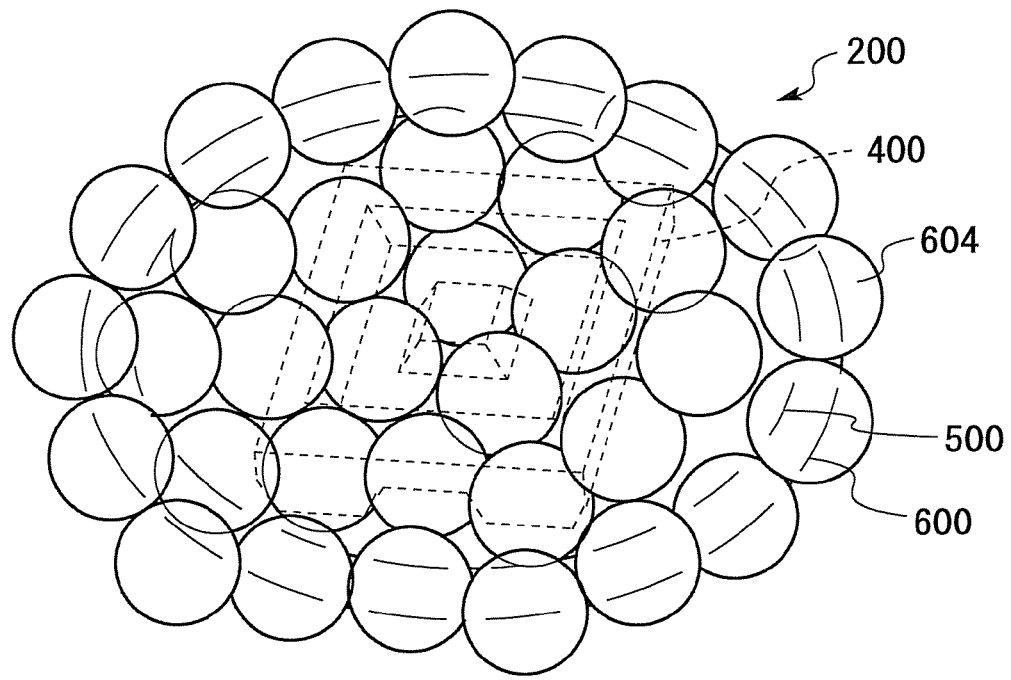
FIG. 39 is a schematic figure showing an example of a shape of a sensing device in accordance with ninth exemplary embodiment.
Figure 40:
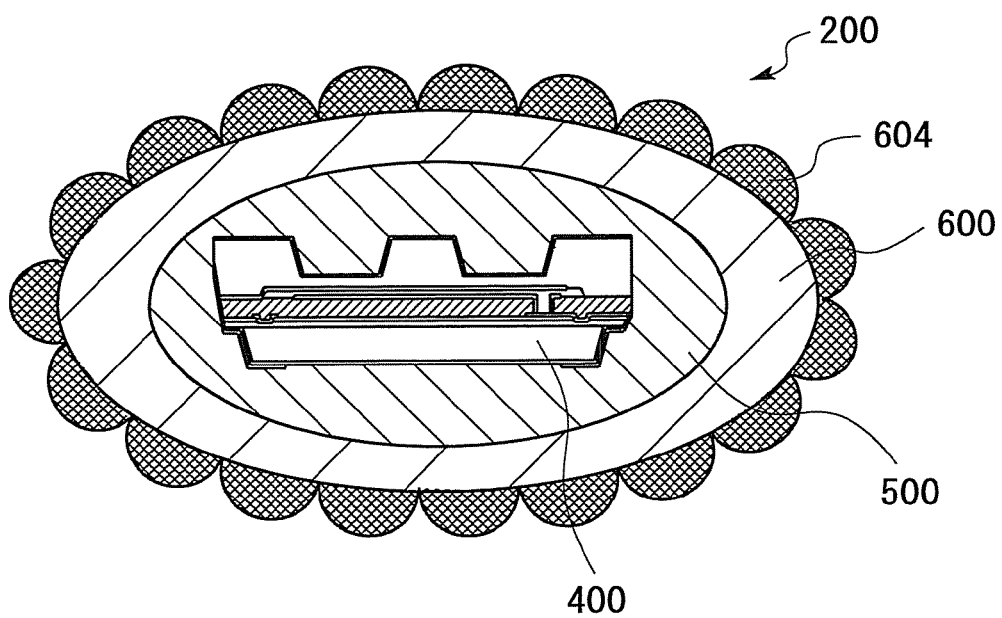
FIG. 40 is a schematic figure showing an example of a shape of a sensing device in accordance with ninth exemplary embodiment.

In FIG. 39, the outer surface of the outer layer portion 600 is covered with spherical or frustum protrusions 604. FIG. 40 is a cross sectional view of FIG. 39. With the configuration like this, when the sensing device 200 and an object to be measure are moved relative to each other while they are in contact with each other, a vibration occurs in the protrusions 604. Since each of the protrusions 604 is formed into a spherical shape, the spherical protrusions 604 are easily vibrated or deformed irrespective of the shape of the object to be measure and the direction of the relative movement. Therefore, it is possible to detect the surface condition, such as roughness and undulation, of the object to be measure with a high resolution.

[Tenth Exemplary Embodiment]

Figure 41:
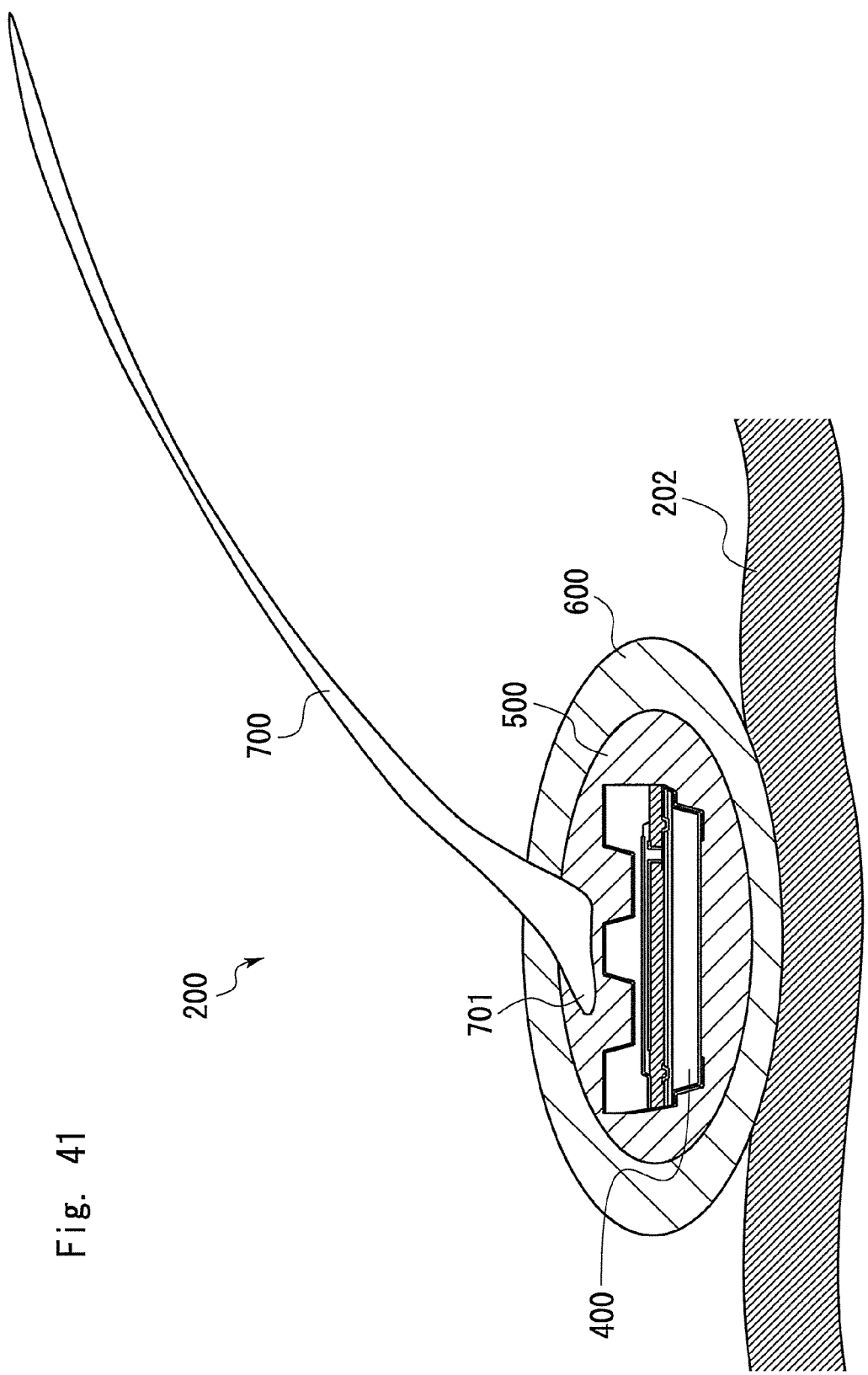
FIG. 41 is a schematic figure showing a case where a needle-like member is provided in a sensing device in accordance with a tenth exemplary embodiment.

Next, as a tenth exemplary embodiment, a case, where a needle-like member 700 that extensively protrudes from the inside to the outside of the sensing device 200 is provided, would be explained. In FIG. 41, a sensing device 200 includes a needle-like member 700. A root portion 701 of the needle-like member 700 extends in width. In other words, the width of the root portion 701 is the widest. The root portion 701 of the needle-like member 700 is buried in the inner layer portion 500 in such a manner that it is located directly above the sensor surface of the sensor 400. The needle-like member 700 extensively protrudes from the inner layer portion 500 and the outer layer portion 600 to the outside. The needle-like member 700 is not disposed perpendicularly to a ground-contact surface 202, but is disposed so as to be slightly inclined with respect to the ground-contact surface 202.

The sensing device 200 including the needle-like member 700 as described above detects the presence of an object that is slightly away from the body surface of the robot 10 like the body hair of a human or the feelers of an insect. Alternatively, the sensing device 200 including the needle-like member 700 detects a flow of wind near the surface of the robot 10.

Note that it is difficult to connect a long tactile-sense stick body to the sensor 400 itself. In addition, since the stress is concentrated on the joint portion, it is easily broken. For this matter, the needle-like member 700 can be easily mounted by burying the root portion 701 of the needle-like member 700 in the inner layer portion 500. Further, since the root and its periphery of the needle-like member 700 are supported by the inner layer portion 500 and the outer layer portion 600, the needle-like member 700 is firmly supported. As a result, the durability and the reliability of the sensing device 200 can be improved.

Further, the needle-like member 700 is provided so as to be inclined. Therefore, the needle-like member 700 can fend off a force exerted in the inclination direction, thus increasing the durability of the needle-like member 700.

Further, the detection characteristic of the sensing device 200 can be changed by changing the elasticity of the outer layer portion 600 and thereby changing the mechanical transfer characteristic of the needle-like member 700. For example, by making the outer layer portion 600 harder or thicker, the needle-like member 700 becomes less prone to being bent, thus widening the detection range for the magnitude of the force.

Figure 42:
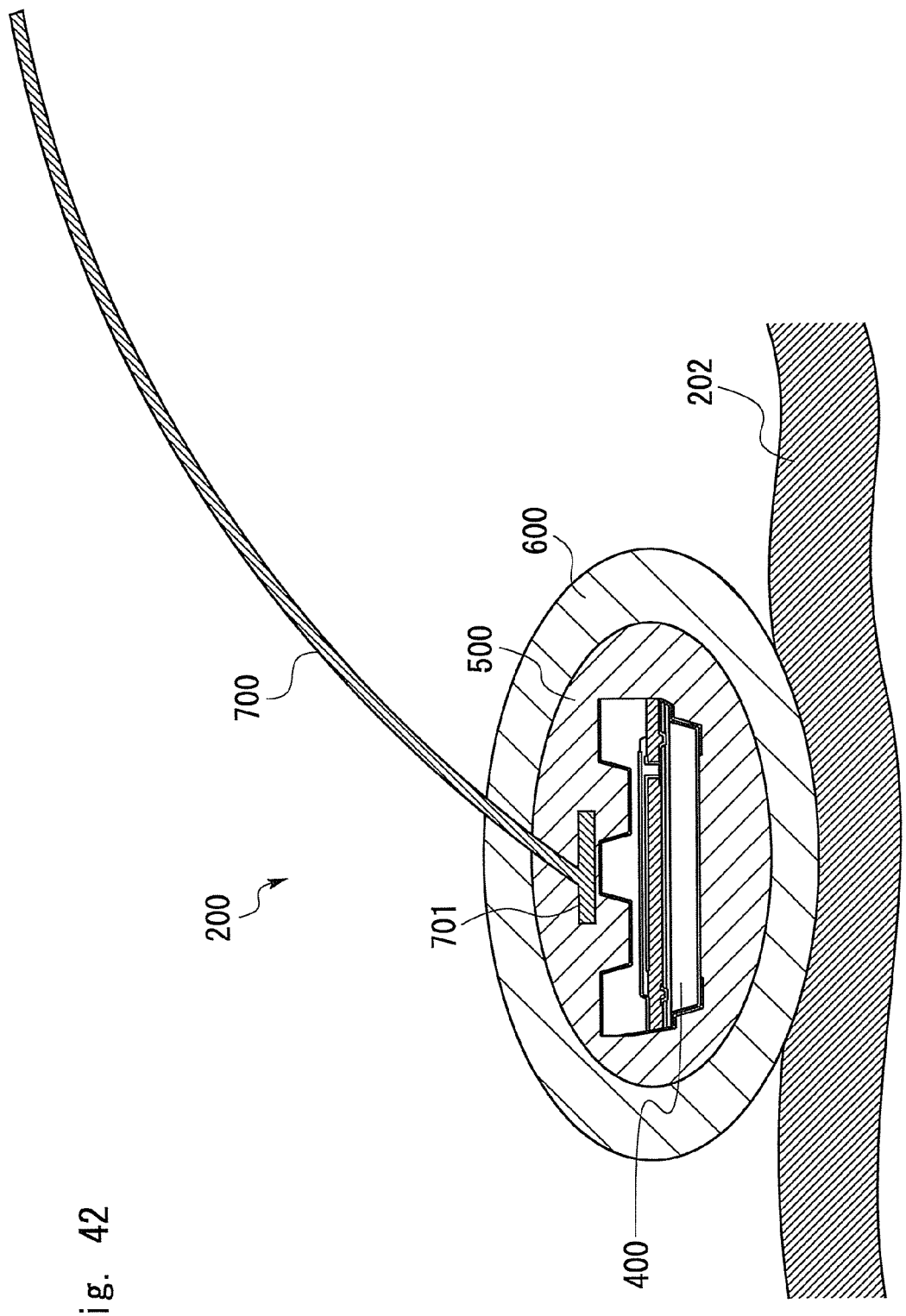
FIG. 42 is a schematic figure showing a case where a needle-like member is provided in a sensing device in accordance with a tenth exemplary embodiment.

Examples of the material used to form the needle-like member 700 include resin and slender metal (FIG. 42).

Figure 43:
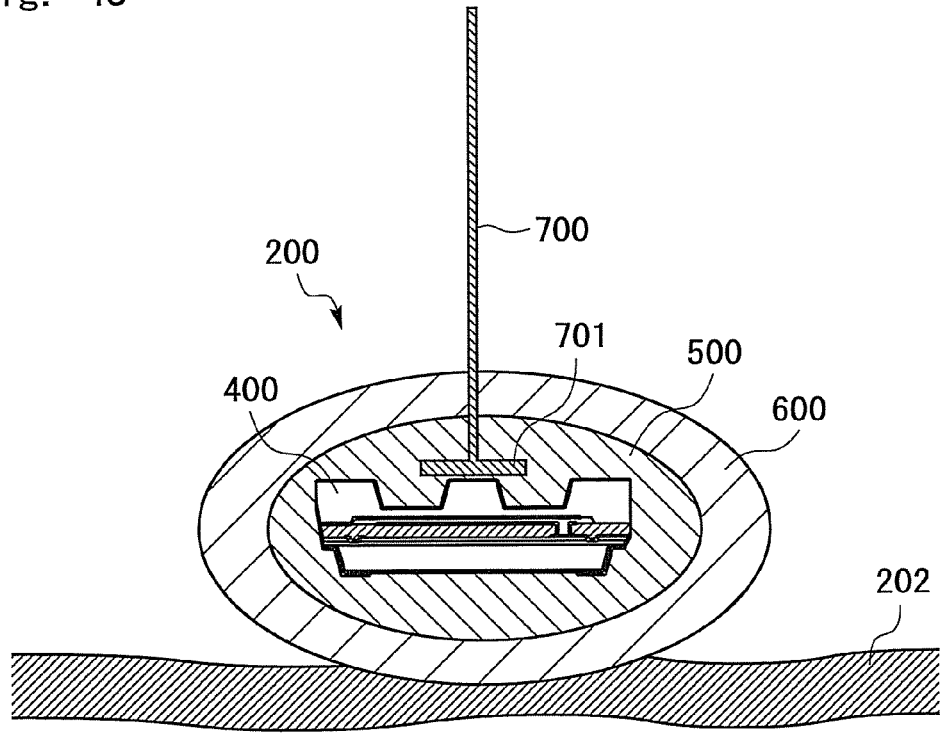
FIG. 43 is a schematic figure showing a case where a needle-like member is provided in a sensing device in accordance with a tenth exemplary embodiment.

FIG. 43 is a schematic figure showing a case where a needle-like member 700 is provided perpendicularly to a ground-contact surface as an example. By disposing the needle-like member 700 vertically in this manner, it is possible to detect a force in three-axis (X, Y and Z axes) directions.

Figure 44:
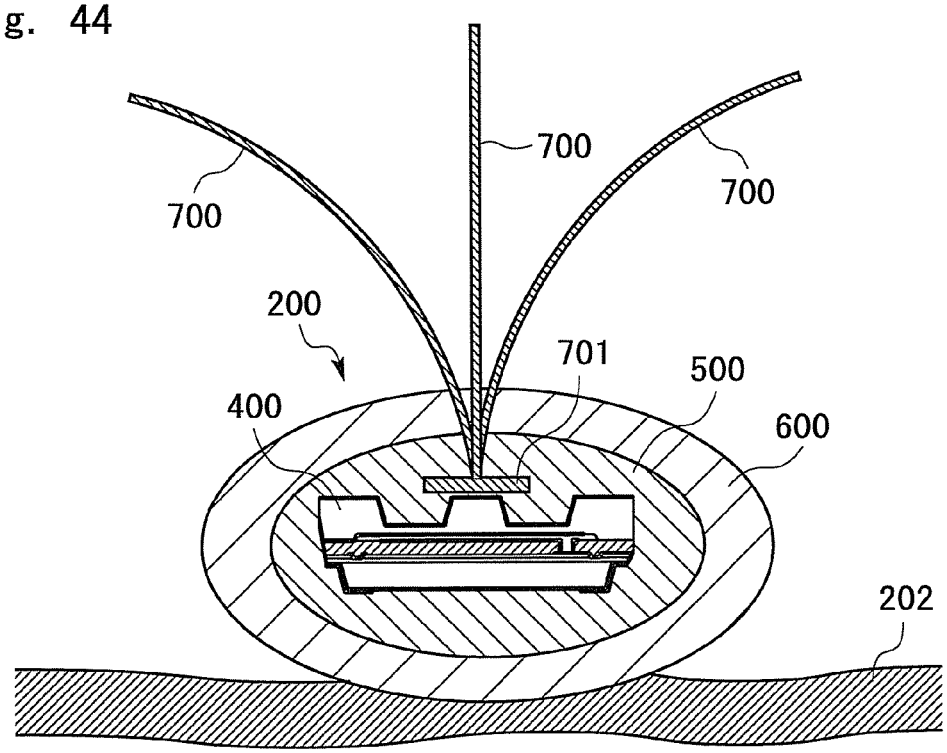
FIG. 44 is a schematic figure showing a case where a needle-like member is provided in a sensing device in accordance with a tenth exemplary embodiment.

FIG. 44 is a schematic figure showing a case where a plurality of needle-like members 700 are provided in one sensing device 200 as an example. In this case, the needle-like members 700 are preferably disposed in different directions from each other. In FIG. 44, one of the needle-like members 700 is vertically disposed and the other two needle-like members 700 are disposed so as to be inclined in opposite directions to each other. With this configuration, a force in three-axis (X, Y and Z axes) directions can be detected in a balanced manner.

Figure 45:
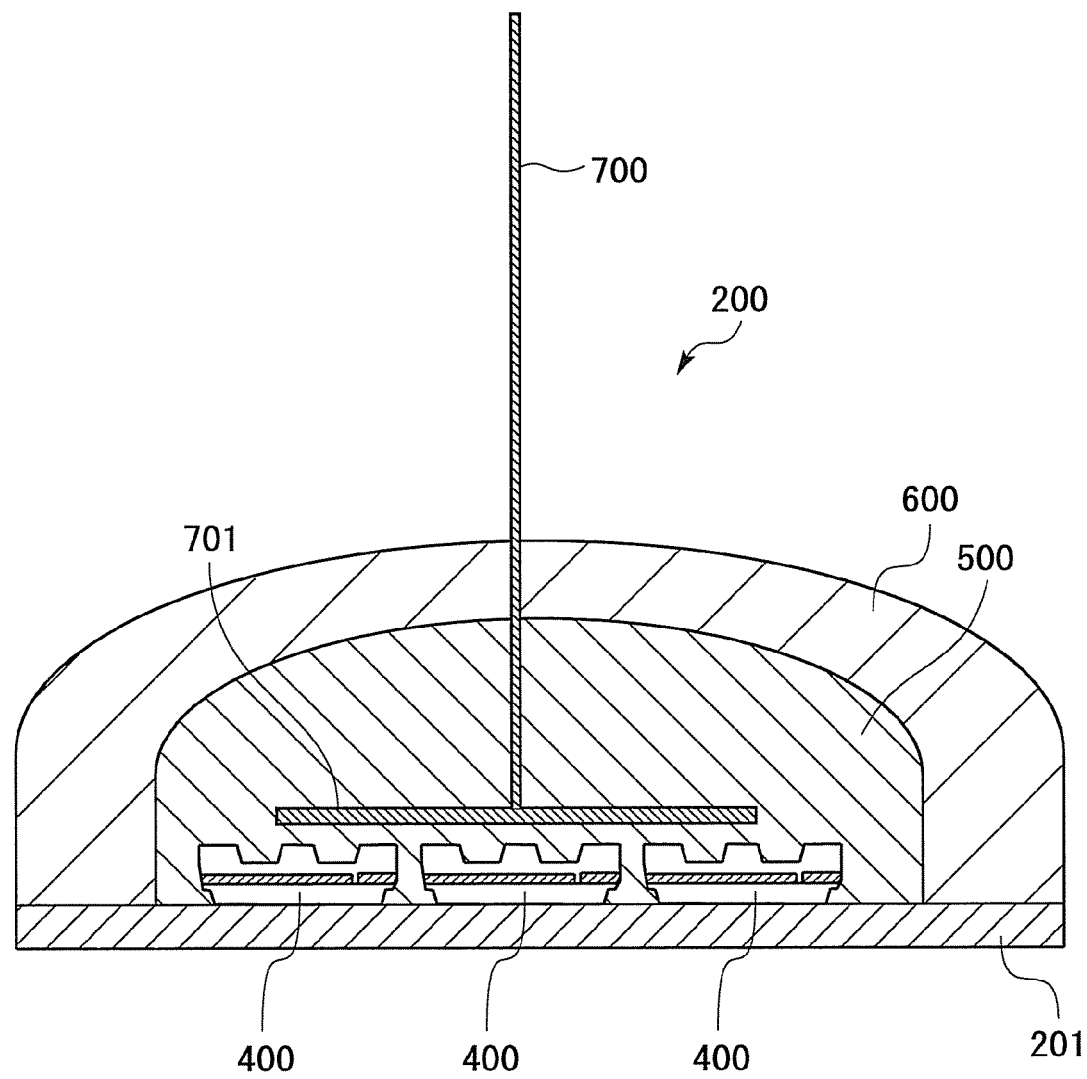
FIG. 45 is a schematic figure showing a case where a needle-like member is provided in a sensing device in accordance with a tenth exemplary embodiment.

In FIG. 45, a plurality of sensors 400 are buried in the inner layer portion 500. As shown in FIG. 45, a plurality of sensors 400 are disposed below the root portion of one needle-like member 700. With this configuration, when a force is applied on the needle-like member in X-axis direction or Y-axis direction, a different component of the force is applied on each of the sensors 400 according to the direction of the force. Therefore, it is possible to detect a force in X-axis direction or Y-axis direction by calculating a difference among detection results obtained by respective sensors 400.

Figure 46:
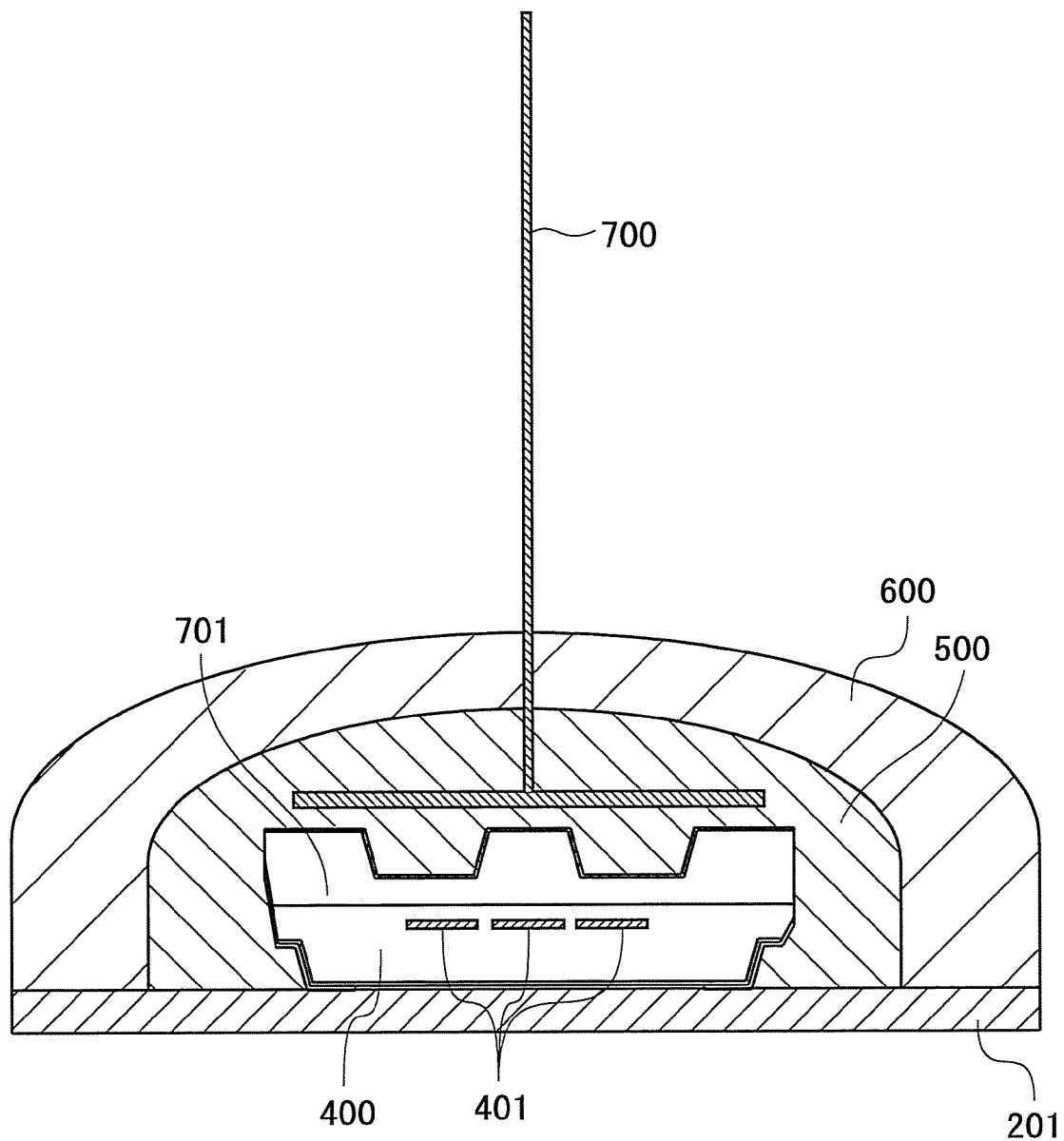
FIG. 46 is a schematic figure showing a case where a needle-like member is provided in a sensing device in accordance with a tenth exemplary embodiment.

Note that a case where a plurality of sensors 400, which are independent of each other, are provided in the inner layer portion is shown in FIG. 45 as an example. However, as shown in FIG. 46, the electrode may be divided into a plurality of electrodes 401 inside one sensor 400 so that a plurality of sensor signals each from one of the electrodes 401 can be obtained.

[Eleventh Exemplary Embodiment]

Figure 47:
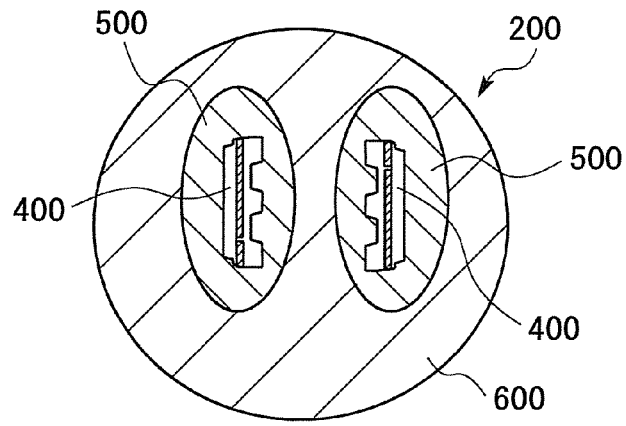
FIG. 47 is a schematic figure showing a case where a plurality of sensors are provided in one sensing device in accordance with an eleventh exemplary embodiment.

As an eleventh exemplary embodiment, a case where a plurality of sensors 400 are provided in one sensing device is explained. In FIG. 47, two sensors 400 are used. Note that each of the sensors 400 is wrapped in a respective one of inner layer portions 500. Further, both of the sensors 400 wrapped in the inner layer portions 500 are buried in one outer layer portion 600, and thereby constitute a pair of sensors.

Note that in FIG. 47, the sensors are disposed in such a manner that their sensor surfaces face each other.

With configuration like this, it is possible to use a difference between detection results from respective sensors 400. By using a difference between detection results obtained by using a plurality of sensors 400 as described above, it is possible to detect, for example, a stress distribution with a high resolution. Further, when the sensors 400 are temperature detection elements, it is possible to improve the temperature detection characteristic by using a difference among detection results from the plurality of sensors 400.

Figure 48:
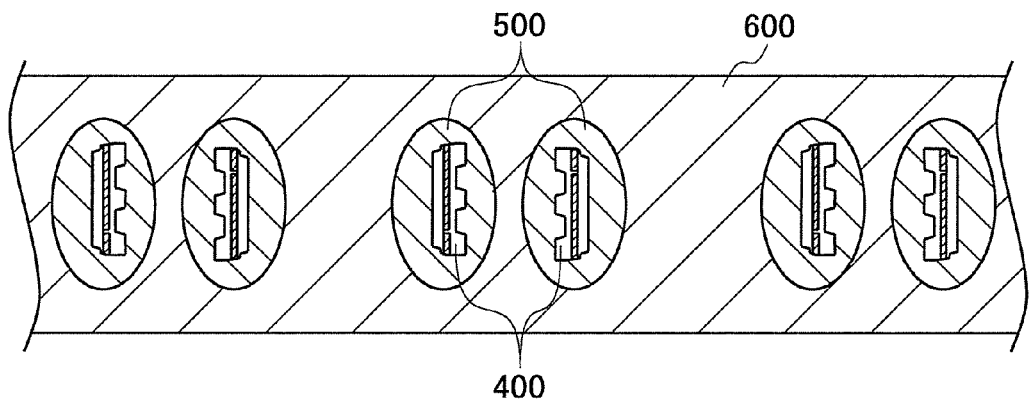
FIG. 48 is a schematic figure showing a case where a plurality of sensors are provided in one sensing device in accordance with an eleventh exemplary embodiment.

Note that as shown in FIG. 48, the outer layer portion 600 may be formed in the form of a band or a sheet so that a plurality of sensors 400 each wrapped in an individual inner layer portion 500 can be provided in one outer layer portion 600.

Figure 49:
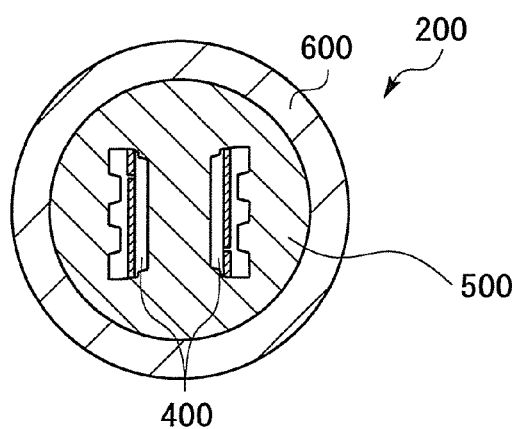
FIG. 49 is a schematic figure showing a case where a plurality of sensors are provided in one sensing device in accordance with an eleventh exemplary embodiment.
Figure 50:
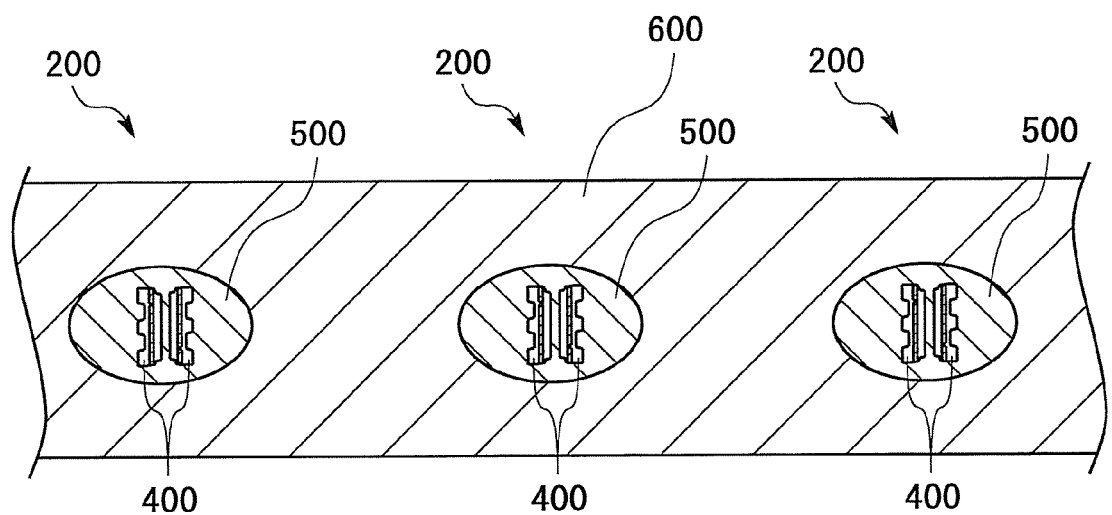
FIG. 50 is a schematic figure showing a case where a plurality of sensors are provided in one sensing device in accordance with an eleventh exemplary embodiment.
Figure 51:
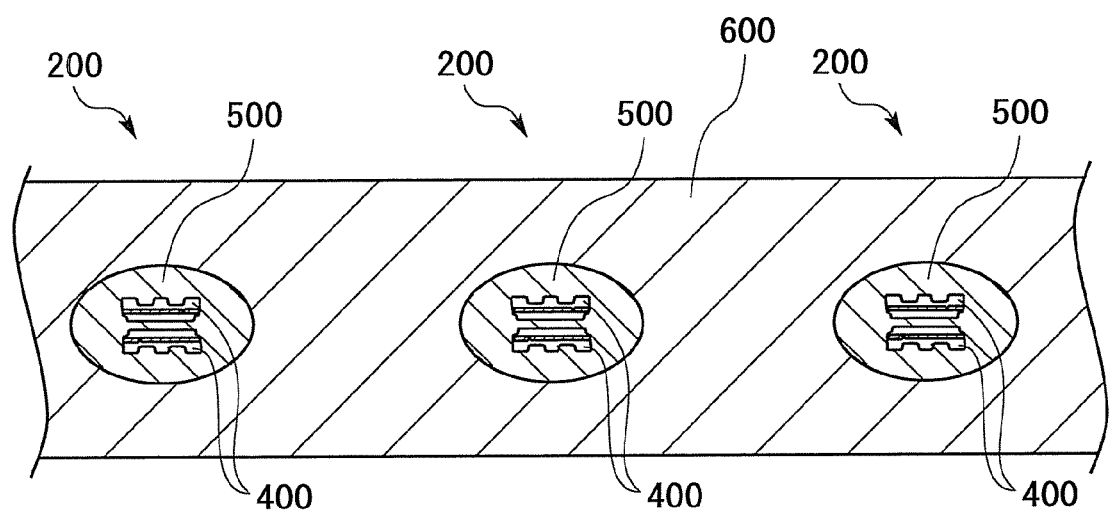
FIG. 51 is a schematic figure showing a case where a plurality of sensors are provided in one sensing device in accordance with an eleventh exemplary embodiment.

In FIG. 49, two sensors 400 are buried in one inner layer portion 500. The sensors are disposed in such a manner that their rear surfaces face each other, and thus their sensor surfaces face opposite directions from each other. When an outer layer portion 600 is disposed, as shown in FIG. 49, an inner layer portion 500 wrapping a pair of sensors therein may be wrapped in an independent outer layer portion 600 for each sensing device 200. Alternatively, as shown in FIG. 50, the outer layer portion 600 may be formed in the form of a band or a sheet so that pairs of sensors 400 each wrapped in an individual inner layer portion 500 can be disposed in the outer layer portion 600. In this case, the pair of sensors 400 may be disposed so that their sensor surfaces face the width direction of the outer layer portion (FIG. 50). Alternatively, they may be disposed so that their sensor surfaces face the thickness direction (FIG. 51).

Figure 52:
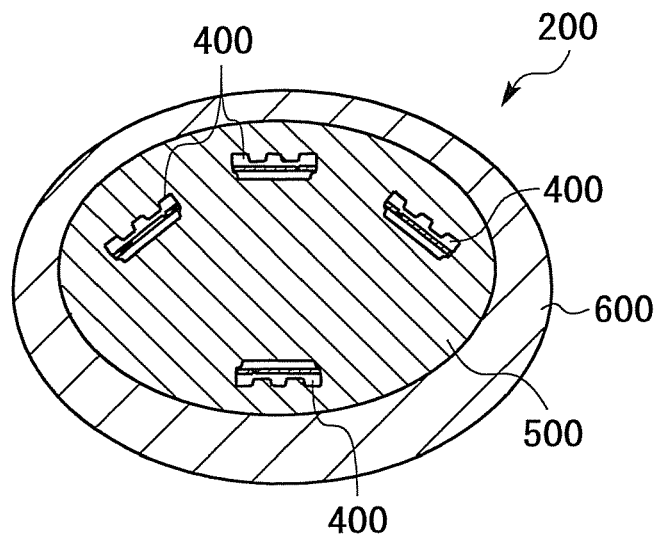
FIG. 52 is a schematic figure showing a case where a plurality of sensors are provided in one sensing device in accordance with an eleventh exemplary embodiment.
Figure 53:
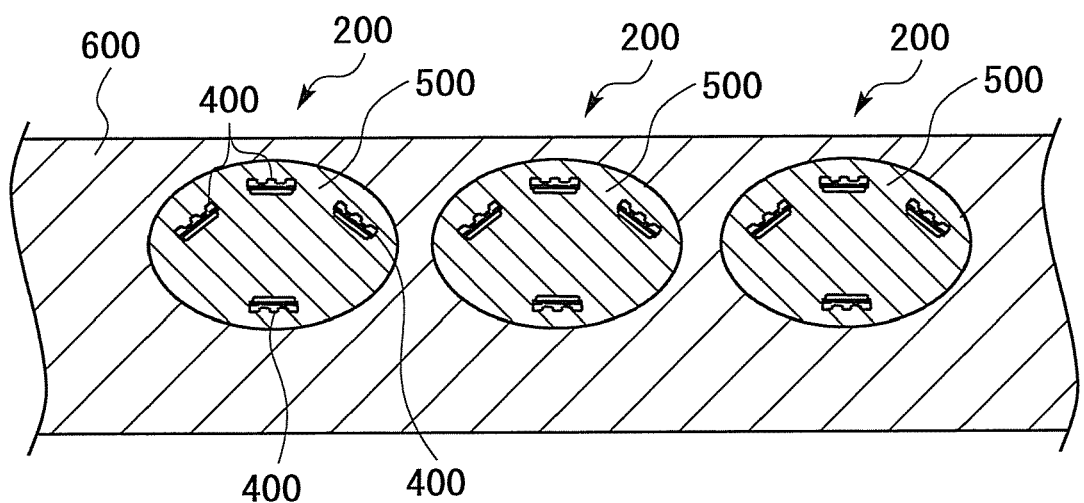
FIG. 53 is a schematic figure showing a case where a plurality of sensors are provided in one sensing device in accordance with an eleventh exemplary embodiment.

Three or more sensors 400 may constitute a set of sensors. FIGS. 52 and 53 show examples where four sensors 400 are provided in one inner layer portion 500.

Figure 54:
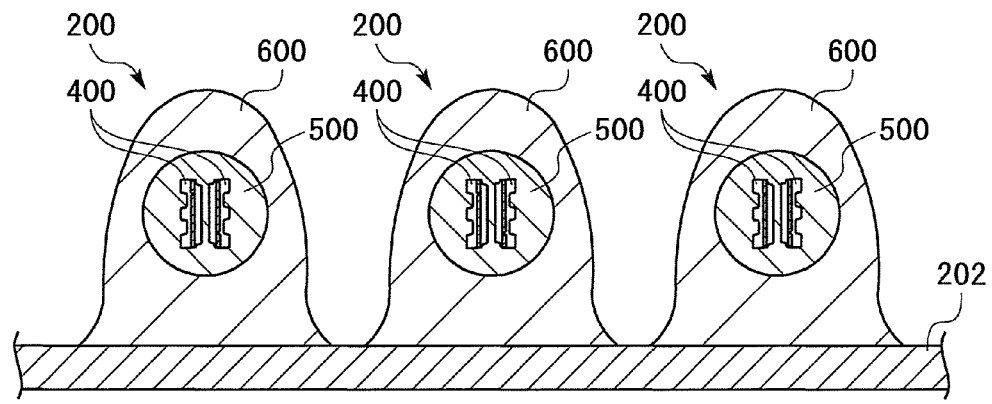
FIG. 54 is a schematic figure showing a case where a plurality of sensors are provided in one sensing device in accordance with an eleventh exemplary embodiment.
Figure 55:
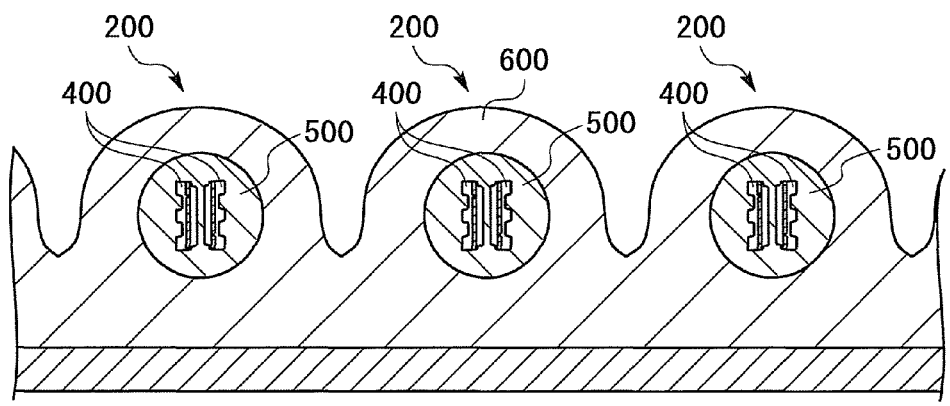
FIG. 55 is a schematic figure showing a case where a plurality of sensors are provided in one sensing device in accordance with an eleventh exemplary embodiment.

When an outer layer portion 600 is disposed, as shown in FIG. 54, a plurality of sensing devices 200 are arranged in such a manner that they are isolated from each other so that the sensing devices 200 become independent of each other. Alternatively, as shown in FIG. 55, they may be disposed so that unevenness is formed on the outer surface of the outer layer portion 600.

[Twelfth Exemplary Embodiment]

Figure 56:
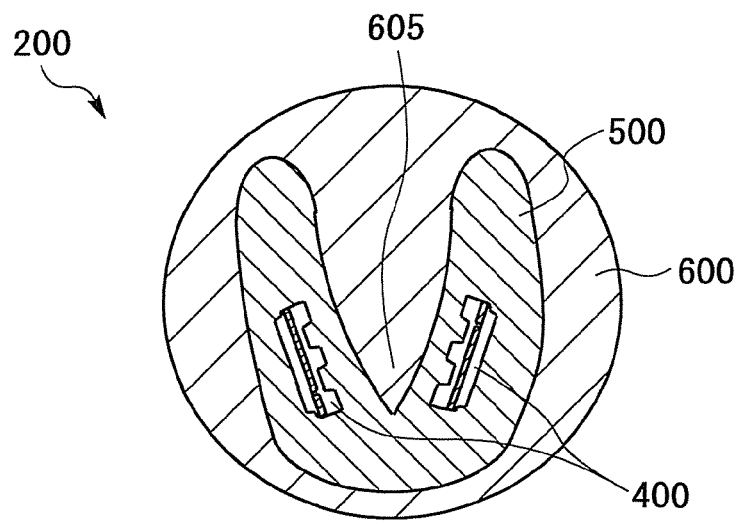
FIG. 56 is a schematic figure showing an example of shapes of an inner layer portion and an outer layer portion in accordance with a twelfth exemplary embodiment.
Figure 57:
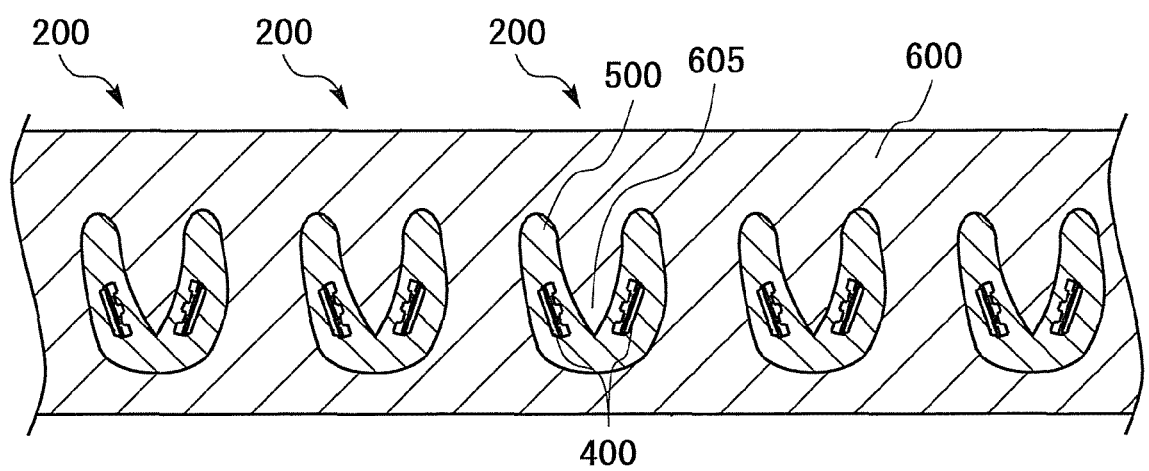
FIG. 57 is a schematic figure showing an example of shapes of an inner layer portion and an outer layer portion in accordance with a twelfth exemplary embodiment.

As a twelfth exemplary embodiment, a pattern of shapes of an inner layer portion 500 and an outer layer portion 600 is explained. In FIGS. 56 and 57, a part of an outer layer portion 600 extends in a tongue shape toward the inside of an inner layer portion 500. This tongue shape is referred to as "tongue piece portion 605". Further, a plurality of sensors 400 are wrapped in the inner layer portion, and the sensors 400 are disposed so as to sandwich the tongue piece portion 605. In other words, the inner layer portion 500 is configured to be U-shape having two sensor 400 opposing one another being embedded thereto. With such a configuration, when a force is applied on the outer surface of the outer layer portion 600, the outer layer portion 600 is deformed. At this point, the tongue piece portion 605 is also deformed. The plurality of sensors 400 acutely detect the deformation of the tongue piece portion 605.

Figure 58:
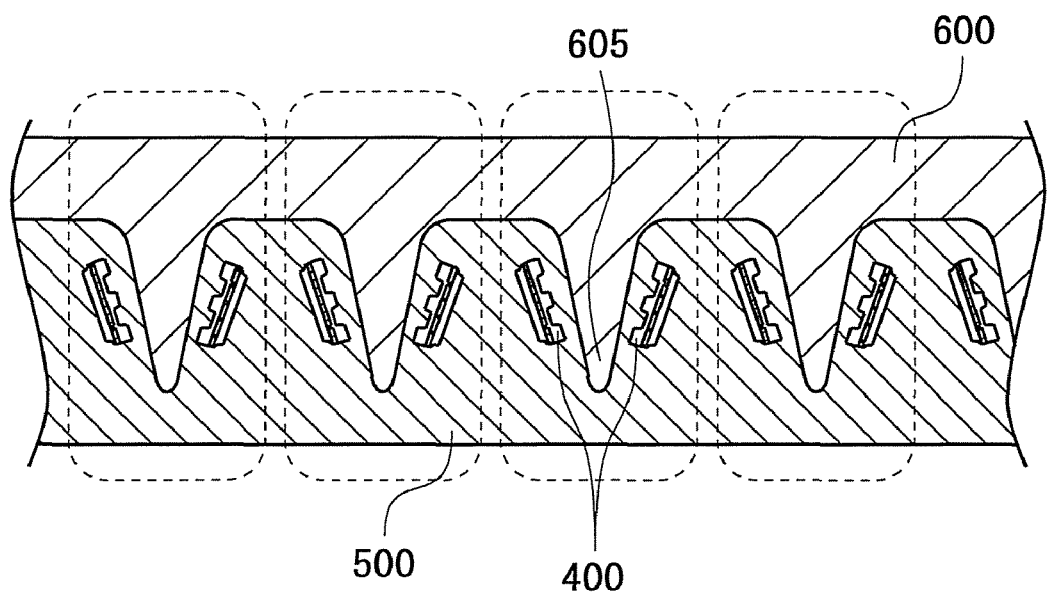
FIG. 58 is a schematic figure showing an example of shapes of an inner layer portion and an outer layer portion in accordance with a twelfth exemplary embodiment.

Further, although a case where the inner layer portions 500 are separated from each other is shown in FIGS. 56 and 57 as an example, the inner layer portions 500 may be continuously connected to each other as shown in FIG. 58.

Figure 59:
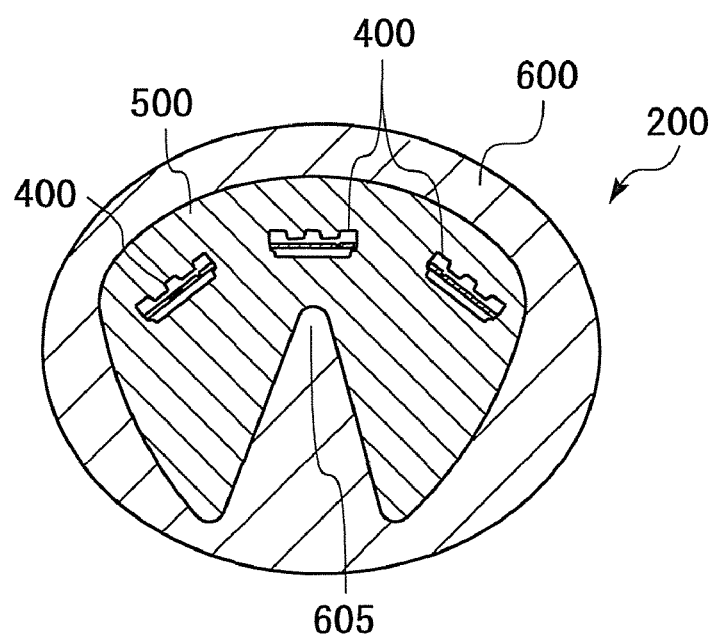
FIG. 59 is a schematic figure showing an example of shapes of an inner layer portion and an outer layer portion in accordance with a twelfth exemplary embodiment.
Figure 60:
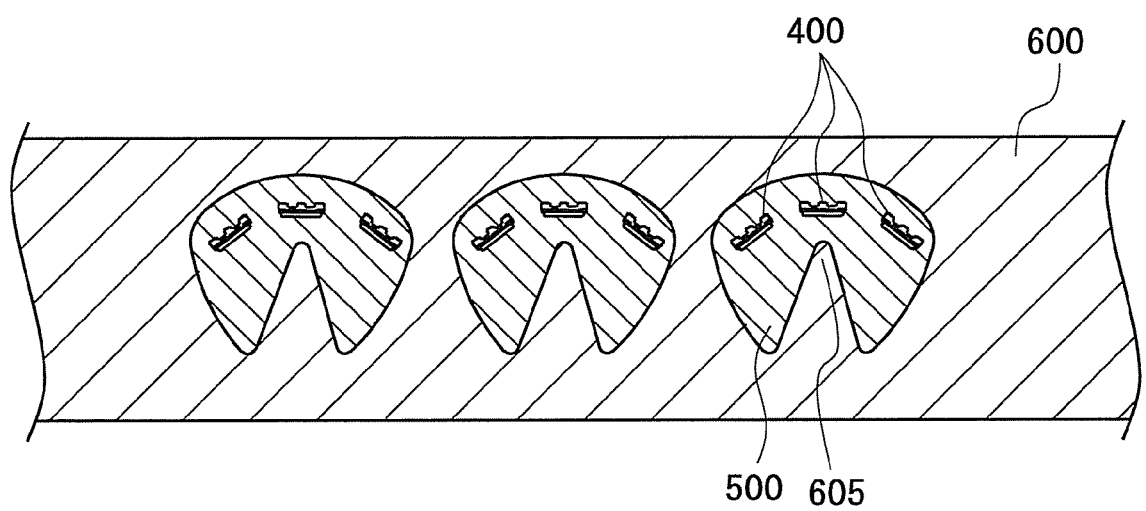
FIG. 60 is a schematic figure showing an example of shapes of an inner layer portion and an outer layer portion in accordance with a twelfth exemplary embodiment.

Note that instead of disposing the sensors 400 so as to sandwich the tongue piece portion 605, the sensors 400 may be disposed in places away from the tongue piece portion 605 as shown in FIGS. 59 and 60.

Note that the present invention is not limited to the above-described exemplary embodiments, and various modifications can be made as appropriate without departing from the spirit of the present invention. In the above-described exemplary embodiments, although cases where a force applied on the sensor is detected based on a change of the distance between two electrodes are explained as an example, the configuration of the sensor is not limited to any particular configuration, provided that a physical quantity that can be used as a detection target can be detected.

As for the configuration of the tactile sensing device, it is preferably formed as one integrated sensing device chip by integrating components of a sensor unit on a substrate as MEMS (Micro Electro Mechanical Systems), further integrating a signal processing unit on a semiconductor substrate, and bonding the MEMS of the sensor unit and the semiconductor substrate of the signal processing unit together. However, the tactile sensing device does not necessarily have to be formed as an integrated device. For example, the sensor unit and the signal processing unit may be formed as separated devices and placed adjacent to each other.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A sensor system comprising a plurality of sensor devices, wherein each of the sensor devices comprises:
    a sensor element;
    an outer layer portion forming an outer surface; and
    an inner layer portion disposed between the sensor element and the outer layer portion, and
    detection characteristics of the sensor devices are different from one another according to detection targets or uses of the sensor devices by changing a combination of an elastic constant and a dumping factor of the inner layer portion and the outer layer portion.

2. The sensor system according to claim 1, wherein a response speed and a sensitivity characteristic of each sensor device for an externally-exerted force are changed by changing a combination of hardness of the inner layer portion and hardness of the outer layer portion.

3. The sensor system according to claim 1, wherein a response speed and a sensitivity characteristic of each sensor device for an externally-exerted force are changed by changing a combination of a thickness of the inner layer portion and a thickness of the outer layer portion.

4. A sensor system comprising a plurality of sensor devices, wherein each of the sensor devices comprises:
    a sensor element;
    an outer layer portion forming an outer surface; and
    an inner layer portion disposed between the sensor element and the outer layer
    a response speed and a sensitivity characteristic of each sensor device for externally-applied heat are changed by changing a combination of a thermal conductivity, a heat capacity, and a specific heat of the inner layer portion and the outer layer portion.

5. The sensor system according to any one of claims 1 and 4, wherein the inner layer portion and the outer layer portion are separated for each of the sensor devices.

6. The sensor system according to any one of claims 1 and 4, wherein a plurality of sensor devices share the outer layer portion.

7. The sensor system according to any one of claims 1 and 4, wherein a plurality of sensor devices share the inner layer portion.

8. The sensor system according to any one of claims 1 and 4, wherein the inner layer portion and the outer layer portion of each of the sensor devices have a semi-cylindrical shape with a vertical plane on a side portion, and a plurality of sensor devices are arranged in a row in a lateral direction.

9. The sensor system according to any one of claims 1 and 4, wherein a streak-like protrusion is provided on the outer surface of the outer layer portion.

10. The sensor system according to any one of claims 1 and 4, wherein a plurality of columnar protrusions are provided on the outer surface of the outer layer portion.

11. The sensor system according to any of claims 1 and 4, wherein a concentric or spiral streak-like protrusion is provided on the outer surface of the outer layer portion.

12. The sensor system according to any one of claims 1 and 4, wherein the outer surface of the outer layer portion is covered with spherical or frustum protrusions.

13. The sensor system according to any one of claims 1 and 4, wherein
    each of the sensor devices includes an externally-protruding needle-like member, and
    the needle-like member includes a root portion buried in the inner layer portion, and a tip portion protruding externally from the outer layer portion.

14. The sensor system according to claim 13, wherein the root portion of the needle-like member has an extended-in-width shape.

15. The sensor system according to claim 13, wherein the needle-like member is disposed so as to be inclined with respect to a contacting surface.

16. The sensor system according to claim 13, wherein the needle-like member is disposed perpendicularly to a contacting surface.

17. The sensor system according to claims 13, wherein a plurality of needle-like members are provided in one sensor device.

18. The sensor system according to claim 17, wherein the needle-like members are disposed in different directions from each other.

19. The sensor system according to any one of claims 1 and 4, wherein one sensor device includes a plurality of sensor elements, and uses a difference between detection results from the respective sensor elements.

20. The sensor system according to claim 19, wherein a part of an outer layer portion extends in a tongue shape toward an inside of the inner layer portion, and a plurality of sensor elements are disposed so as to sandwich a tongue-shaped portion.

21. A sensor system according to any one of claims 1 and 4, wherein a sensor element has unevenness on its surface.

22. The sensor system according to any one of claims 1 and 4, wherein a plurality of sensor devices are arranged in a one-dimensional fashion or a two-dimensional fashion, and the number of sensor devices having a faster response speed for an externally-exerted force or heat is greater than the number of sensor devices having a slower response speed.

* * * * *